US012498636B2

(12) United States Patent
Sawamoto et al.

(10) Patent No.: US 12,498,636 B2
(45) Date of Patent: Dec. 16, 2025

(54) PHOTOSENSITIVE RESIN COMPOSITION, PHOTOSENSITIVE RESIN FILM, MULTILAYERED PRINTED WIRING BOARD, SEMICONDUCTOR PACKAGE, AND METHOD FOR PRODUCING MULTILAYERED PRINTED WIRING BOARD

(71) Applicant: Showa Denko Materials Co., Ltd., Tokyo (JP)

(72) Inventors: Hayato Sawamoto, Tokyo (JP); Shuji Nomoto, Tokyo (JP); Akihiro Nakamura, Tokyo (JP); Kohei Otsuka, Tokyo (JP); Yuya Akiyama, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 703 days.

(21) Appl. No.: 17/792,883

(22) PCT Filed: Jul. 5, 2021

(86) PCT No.: PCT/JP2021/025289
§ 371 (c)(1),
(2) Date: Jul. 14, 2022

(87) PCT Pub. No.: WO2022/107380
PCT Pub. Date: May 27, 2022

(65) Prior Publication Data
US 2023/0047699 A1    Feb. 16, 2023

(30) Foreign Application Priority Data
Nov. 17, 2020 (JP) .................. 2020-191235

(51) Int. Cl.
*G03F 7/028* (2006.01)
*C08K 3/013* (2018.01)
(Continued)

(52) U.S. Cl.
CPC ............. *G03F 7/028* (2013.01); *C08K 3/013* (2018.01); *H01L 21/481* (2013.01);
(Continued)

(58) Field of Classification Search
CPC ...................................... G03F 7/028
See application file for complete search history.

(56) References Cited

U.S. PATENT DOCUMENTS 12,103,999 B2 * 10/2024 Nakamura ................ G03F 7/40

FOREIGN PATENT DOCUMENTS

JP    07-304931 A    11/1995
JP    10282666 A * 10/1998
(Continued)

OTHER PUBLICATIONS

Machine translation of JP 10-282666 (no date) (Year: 0000).*
Machine translation of JP 2008-246858 (no date) (Year: 0000).*
Machine translation of JP 2017-003967 (no date) (Year: 0000).*

*Primary Examiner* — Amanda C. Walke
(74) *Attorney, Agent, or Firm* — FITCH, EVEN, TABIN & FLANNERY, LLP

(57) ABSTRACT

Provided is a photosensitive resin composition containing: a photopolymerizable compound (A) having an ethylenically unsaturated group; a photopolymerization initiator (B); and an inorganic filler (F), in which the photopolymerizable compound (A) having an ethylenically unsaturated group includes a photopolymerizable compound (A1) having an acidic substituent and an alicyclic structure together with an ethylenically unsaturated group, and the inorganic filler (F) includes an inorganic filler surface-treated with a coupling agent without at least one functional group selected from the group consisting of an amino group and a (meth)acryloyl group. The present disclosure also provides a photosensitive resin composition for photo via formation, and a photosensitive resin composition for interlayer insulating layer. The (Continued)

present disclosure further provides: a photosensitive resin film and a photosensitive resin film for interlayer insulating layer, each of which contains the photosensitive resin composition; a multilayered printed wiring board and a semiconductor package; and a method for producing a multilayered printed wiring board.

19 Claims, 1 Drawing Sheet

(51) Int. Cl.
*H01L 21/48* (2006.01)
*H01L 23/498* (2006.01)
*H05K 1/03* (2006.01)
*H05K 3/38* (2006.01)
*H05K 3/10* (2006.01)
*H05K 3/18* (2006.01)
*H05K 3/42* (2006.01)

(52) U.S. Cl.
CPC ..... H01L 23/49894 (2013.01); H05K 1/0373 (2013.01); H05K 3/389 (2013.01); *H01L 23/49822* (2013.01); *H05K 3/108* (2013.01); *H05K 3/18* (2013.01); *H05K 3/423* (2013.01); *H05K 2201/0239* (2013.01); *H05K 2201/209* (2013.01); *H05K 2203/072* (2013.01); *H05K 2203/0723* (2013.01)

(56) References Cited

FOREIGN PATENT DOCUMENTS

| | | | |
|---|---|---|---|
| JP | 2008246858 A | * | 10/2008 |
| JP | 2012041510 A | * | 3/2012 |
| JP | 2013-41114 A | | 2/2013 |
| JP | 2013115171 A | * | 6/2013 |
| JP | 2017-3967 A | | 1/2017 |
| JP | 2017-116652 A | | 6/2017 |
| JP | 2018-156111 A | | 10/2018 |
| JP | 2019-066793 A | | 4/2019 |
| JP | 2019-179231 A | | 10/2019 |
| JP | 2020-166032 A | | 10/2020 |
| JP | 2020-166215 A | | 10/2020 |
| KR | 10-2019-0022517 A | | 3/2019 |
| WO | WO-2018225441 A1 | * | 12/2018 ............... C08K 3/36 |

* cited by examiner

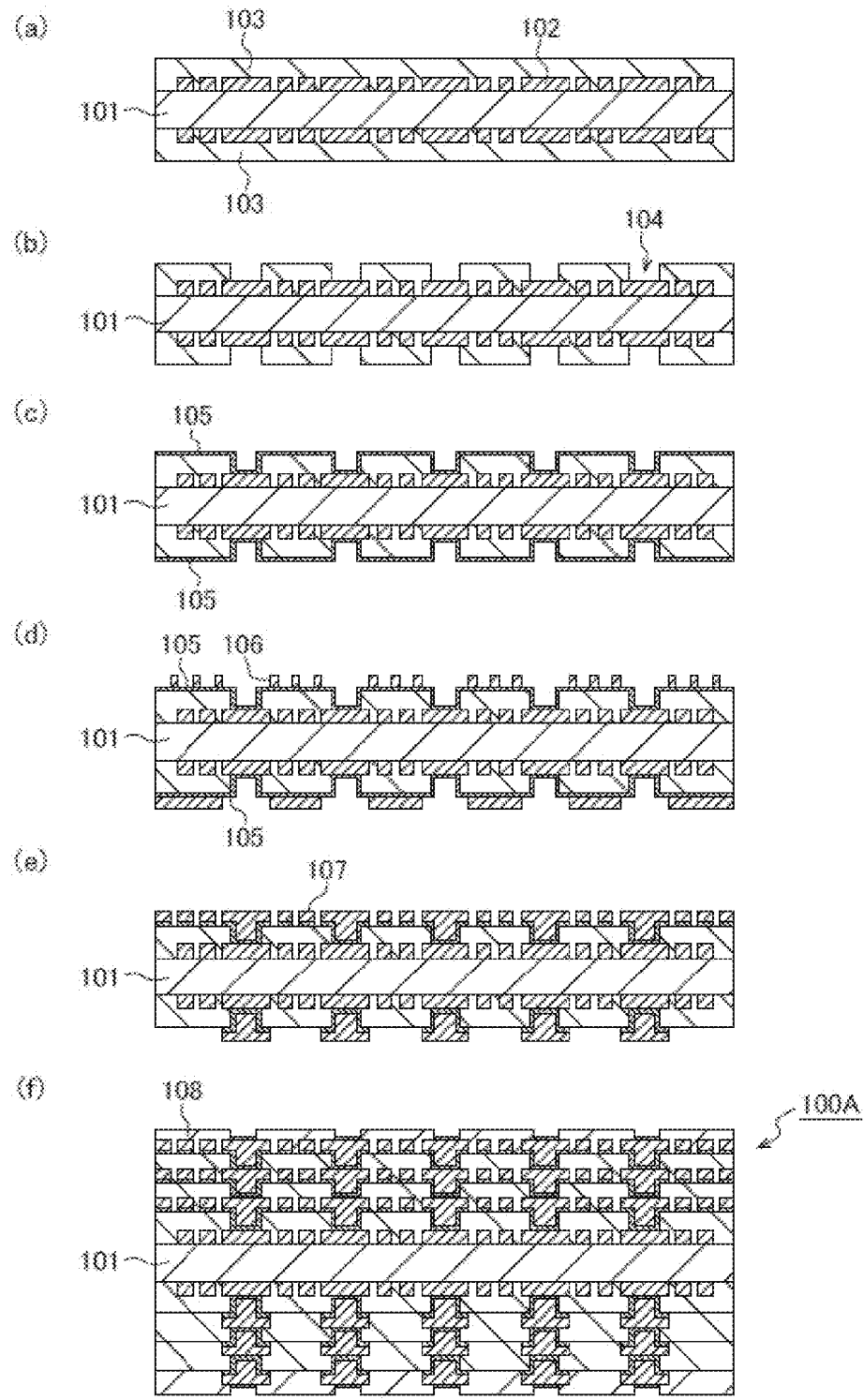

PHOTOSENSITIVE RESIN COMPOSITION, PHOTOSENSITIVE RESIN FILM, MULTILAYERED PRINTED WIRING BOARD, SEMICONDUCTOR PACKAGE, AND METHOD FOR PRODUCING MULTILAYERED PRINTED WIRING BOARD

CROSS-REFERENCE TO RELATED APPLICATIONS

This application is a U.S. national phase application filed under 35 U.S.C. § 371 of International Application No. PCT/JP2021/025289, filed Jul. 5, 2021, which claims benefit of the filing date of Japanese patent application no. JP 2020-191235, filed Nov. 17, 2020, both of which are incorporated herein by reference in their entireties.

TECHNICAL FIELD

The present disclosure relates to a photosensitive resin composition, a photosensitive resin film, a multilayered printed wiring board, a semiconductor package, and a method for producing a multilayered printed wiring board.

BACKGROUND ART

In recent years, miniaturization and increase of performance of electronic instruments are advanced, and in multilayered printed wiring boards, densification owing to an increase of the number of circuit layers and miniaturization of wiring proceeds. In particular, densification of a semiconductor package substrate on which a semiconductor chip is mounted, such as BGA (ball grid array) and CSP (chip size package) is conspicuous, and in addition to the miniaturization of wiring, thinning of an insulating film and more reduction in diameter of a via for interlayer connection (also referred to as "via hole") are demanded. In addition to the above, following the thinning of the insulating film in a printed wiring board, an excellent interlayer electrical insulation reliability [in particular, electrical insulation reliability after moisture absorption (HAST (High Accelerated Stress Test) resistance)] is also demanded.

As a production method of a printed wiring board, there is exemplified a production method of a multilayered printed wiring board by a build-up method for successively laminating an interlayer insulating layer and a conductor circuit layer to form a multilayered printed wiring board (see, for example, PTL 1). In the multilayered printed wiring board, following the miniaturization of a circuit, a semi-additive process for forming a circuit by means of plating has become the mainstream.

In the conventional semi-additive process, for example, (1) a thermosetting resin film is laminated on a conductor circuit, and the thermosetting resin film is cured upon heating, to form an "interlayer insulating layer". (2) Subsequently a via for interlayer connection is formed by means of laser processing, followed by performing a desmear treatment and a roughening treatment by means of an alkaline permanganate treatment, or the like. (3) Thereafter, a substrate is subjected to an electroless copper plating treatment, and after forming a pattern using a resist, an electrolytic copper plating treatment is performed to form a copper circuit layer. (4) Subsequently resist stripping is performed, and flash etching of an electroless layer is performed, whereby a copper circuit is formed (see, for example, PTL 2).

As mentioned above, the laser processing is the mainstream as a method for forming a via in the interlayer insulating layer formed upon curing the thermosetting resin film. However, the reduction in diameter of the via by means of laser irradiation using a laser processing machine reaches the limit. Furthermore, in forming the via by the laser processing machine, it is needed to form the respective via holes one by one, and in the case where it is needed to form a large number of vias by means of densification, there is involved such a problem that a lot of time is required for forming the vias, so that the production efficiency is poor.

Under such circumstances, as a method in which a large number of vias can be collectively formed, there is proposed a method of collectively forming a plurality of reduced-diameter vias by the photolithography method by using a photosensitive resin composition containing (A) an acid-modified vinyl group-containing epoxy resin, (B) a photopolymerizable compound, (C) a photopolymerization initiator, (D) an inorganic filler, and (E) a silane compound, in which the content of the inorganic filler (D) is 10 to 80% by mass (see, for example, PTL 3).

CITATION LIST

Patent Literature

PTL 1: JP 7-304931 A
PTL 2: JP 2019-066793 A
PTL 3: JP 2017-116652 A

SUMMARY OF INVENTION

Technical Problem

In PTL 2, it is found that an alkali-developable photosensitive resin composition containing an alkali-soluble resin having a carboxy group and an ethylenically unsaturated group in the molecule, a photopolymerization initiator, and a cyanate ester compound has excellent desmear resistance. However, in addition to further miniaturization of wiring, thinning of the insulating film and the reduction in diameter of the via hole for interlayer connection is advanced, and thus there is an increasing demand for improvements in adhesion strength to plated copper and electrical insulation reliability. In addition to the above, there is an increasing demand for improvement in desmear resistance, and in these respects, there is room for further improvement in the photosensitive resin composition of PTL 2.

In PTL 3, it is considered to be one of issues to suppress lowering of the adhesion strength to plated copper to be caused due to use of the photosensitive resin composition as a material of the interlayer insulating layer or surface protective layer in place of the conventional thermosetting resin composition, and further the resolution of via and the adhesion between the substrate of a silicon material and a chip component are also issues, and these are solved. However, as described above, there is the increasing demand for improvements in adhesion strength to plated copper and electrical insulation reliability and in these respects, there is room for further improvement in the photosensitive resin composition of PTL 3.

Note that, as a material of the interlayer insulating layer, it may be considered to divert a photosensitive resin composition or the like that is the conventional material of a solder resist. However, since the interlayer insulating layer is required to have characteristics that are unnecessary for the solder resist (for example, interlayer electrical insulation reliability adhesion strength to plated copper, high heat resistance endurable against heating of plural times, high dimensional accuracy of via shape, or the like), it is difficult to expect whether or not the solder resist is practically endurable as the interlayer insulating layer, and the solder resist cannot be easily diverted.

Thus, an object of the present disclosure is to provide a photosensitive resin composition, a photosensitive resin composition for photo via formation, and a photosensitive resin composition for interlayer insulating layer, each of which is excellent in resolution of via, adhesion strength to plated copper, electrical insulation reliability, and desmear resistance. In addition, another object of the present disclosure is to provide a photosensitive resin film and a photosensitive resin film for interlayer insulating layer, each of which contains the photosensitive resin composition, to provide a multilayered printed wiring board and a semiconductor package, and to provide a method for producing the multilayered printed wiring board.

Solution to Problem

As a result of diligent research, the present inventors have found that the above object can be achieved by the present disclosure. The present disclosure includes the following embodiments [1] to [19].

[1] A photosensitive resin composition containing a photopolymerizable compound (A) having an ethylenically unsaturated group, a photopolymerization initiator (B), and an inorganic filler (F), in which the photopolymerizable compound (A) having an ethylenically unsaturated group includes a photopolymerizable compound (A1) having an acidic substituent and an alicyclic structure together with an ethylenically unsaturated group, and the inorganic filler (F) includes an inorganic filler surface-treated with a coupling agent without at least one functional group selected from the group consisting of an amino group and a (meth)acryloyl group.

[2] The photosensitive resin composition according to the above [1], in which the coupling agent has a group including an alkoxy group.

[3] The photosensitive resin composition according to the above [1] or [2], in which an average particle size of the inorganic filler (F) is 0.01 to 5 μm.

[4] The photosensitive resin composition according to any one of the above [1] to [3], in which the content of the inorganic filler (F) is 5 to 80% by mass based on the total solid content.

[5] The photosensitive resin composition according to any one of the above [1] to [4], in which the photopolymerizable compound (A) having an ethylenically unsaturated group further includes at least one selected from the group consisting of a monofunctional vinyl monomer (Ai) having one polymerizable ethylenically unsaturated group, a bifunctional vinyl monomer (Aii) having two polymerizable ethylenically unsaturated groups, and a polyfunctional vinyl monomer (Aiii) having at least three polymerizable ethylenically unsaturated groups.

[6] The photosensitive resin composition according to any one of the above [1] to [5], in which in the photopolymerizable compound (A1) having an acidic substituent and an alicyclic structure together with an ethylenically unsaturated group, the alicyclic structure is an alicyclic structure having a ring-forming carbon number of 5 to 20.

[7] The photosensitive resin composition according to any one of the above [1] to [5], in which in the photopolymerizable compound (A1) having an acidic substituent and an alicyclic structure together with an ethylenically unsaturated group, the alicyclic structure includes two or more rings.

[8] The photosensitive resin composition according to any one of the above [1] to [7], further containing a thermosetting resin (C).

[9] The photosensitive resin composition according to any one of the above [1] to [8], further containing an elastomer (D).

[10] The photosensitive resin composition according to the above [9], in which the elastomer (D) includes at least one selected from the group consisting of a styrene-based elastomer, an olefin-based elastomer, a polyester-based elastomer, a urethane-based elastomer, a polyamide-based elastomer, an acrylic elastomer, and a silicone-based elastomer.

[11] The photosensitive resin composition according to any one of above [1] to [10], in which the content of the photopolymerizable compound (A) having an ethylenically unsaturated group is 0.1 to 60% by mass based on the total solid content of the photosensitive resin composition.

[12] A photosensitive resin composition for photo via formation, containing the photosensitive resin composition according to any one of the above [1] to [11].

[13] A photosensitive resin composition for interlayer insulating layer, including the photosensitive resin composition according to any one of the above [1] to [11].

[14] A photosensitive resin film including the photosensitive resin composition according to any one of the above [1] to [11].

[15] A photosensitive resin film for interlayer insulating layer, including the photosensitive resin composition according to any one of the above [1] to [11].

[16] A multilayered printed wiring board including an interlayer insulating layer formed of the photosensitive resin composition according to any one of the above [1] to [11].

[17] A multilayered printed wiring board including an interlayer insulating layer formed of the photosensitive resin film according to the above [14].

[18] A semiconductor package including the multilayered printed wiring board according to the above [16] or [17] and a semiconductor element.

[19] A method for producing a multilayered printed wiring board, including the following (1) to (4):
  (1) laminating the photosensitive resin film according to the above [14] on one surface or both surfaces of a circuit substrate;
  (2) exposing and developing the photosensitive resin film laminated in the above (1), to form an interlayer insulating layer having a via;
  (3) subjecting the via and the interlayer insulating layer to a roughening treatment; and
  (4) forming a circuit pattern on the interlayer insulating layer.

Advantageous Effects of Invention

According to the present disclosure, it is possible to provide a photosensitive resin composition, a photosensitive resin composition for photo via formation, and a photosensitive resin composition for interlayer insulating layer, each of which is excellent in resolution of via, adhesion strength to plated copper, electrical insulation reliability and desmear resistance. In addition, it is also possible to provide a photosensitive resin film and a photosensitive resin film for interlayer insulating layer, each of which contains the photosensitive resin composition, and to provide a multilayered printed wiring board and a semiconductor package, each of which includes an interlayer insulating layer formed of the photosensitive resin composition or the photosensitive resin film.

Furthermore, it is possible to provide a method for efficiently producing a multilayered printed wiring board having a via with a high resolution, a high adhesion strength between the interlayer insulating layer and the plated copper, and excellent electrical insulation reliability. The via which the multilayered printed wiring board obtained in the production method of the present disclosure has can be made smaller in diameter than a via formed by means of laser processing.

BRIEF DESCRIPTION OF DRAWING

FIG. 1 is a schematic view illustrating an aspect of a production process of a multilayered printed wiring board of the present embodiment.

DESCRIPTION OF EMBODIMENTS

In numerical value ranges described in the present specification, an upper limit value or a lower limit value in a respective numerical value range may be substituted by a value described in Examples. In addition, the lower limit value and the upper limit value of the numerical value range are each arbitrarily combined with a lower limit value or an upper limit value of another numerical value range. In the notation of the numerical range "AA to BB", the numerical values AA and BB at both ends are included in the numerical range as the lower limit value and the upper limit value, respectively.

In this specification, for example, the description of "10 or more" means 10 and numerical values exceeding 10, and the same applies when the numerical values are different. Further, for example, the description "10 or less" means 10 and numerical values less than 10, and the same applies when the numerical values are different.

Furthermore, in this specification, as for the content of a respective component in the photosensitive resin composition, in the case where plural kinds of substances corresponding to the respective component exist, it means a total content of the plural kinds of substances existing in the photosensitive resin composition unless otherwise indicated.

The term "ring-forming carbon number" in this specification is the number of carbon atoms necessary for forming the ring, and the number of carbon atoms of a substituent which the ring has is not included. For example, in both a cyclohexane structure and a methylcyclohexane structure, the ring-forming carbon number is 6.

The notation "(meth)acrylic XX" means one or both of acrylic XX and its corresponding methacrylic XX. Further, "(meth)acryloyl group" means one or both of an acryloyl group and a methacryloyl group.

Aspects of any combination of the matters described in this specification are also included in the present embodiment.

[Photosensitive Resin Composition, Photosensitive Resin Composition for Photo Via Formation, and Photosensitive Resin Composition for Interlayer Insulating Layer]

The photosensitive resin composition according to this embodiment (hereinafter occasionally referred to simply as "this embodiment") is a photosensitive resin composition containing a photopolymerizable compound (A) having an ethylenically unsaturated group, a photopolymerization initiator (B), and an inorganic filler (F), in which the photopolymerizable compound (A) having an ethylenically unsaturated group contains a photopolymerizable compound (A1) having an acidic substituent and an alicyclic structure together with an ethylenically unsaturated group, and the inorganic filler (F) contains an inorganic filler surface-treated with a coupling agent without at least one functional group selected from the group consisting of an amino group and a (meth)acryloyl group.

In this specification, the components are occasionally referred to as a component (A), a component (B), a component (F), a component (A1), and the like, and other components are also occasionally referred to in the same way. In this specification, the "resin components" are the component (A), the component (B), and the like, and other components (for example, components (C), (D), (E), and (H), and the like) that may be contained as needed are also included, but inorganic compounds such as the inorganic filler (F) and a pigment (G) are not included. In addition, the "solid component" means a nonvolatile component contained in the photosensitive resin composition, exclusive of a volatile substance such as water and a solvent, and refers to a component that remains without being volatilized when the resin composition is dried, and it also includes those which are in a liquid state, a starch syrup-like state, or a waxy state at room temperature in the vicinity of 25° C.

Since the photosensitive resin composition of this embodiment is suitable for via formation by means of photolithography (hereinafter also referred to as "photo via formation"), the present disclosure also provides a photosensitive resin composition for photo via formation. In addition, since the photosensitive resin composition of this embodiment is excellent in resolution of via, adhesion strength to plated copper, electrical insulation reliability, and desmear resistance, and is useful as an interlayer insulating layer of a multilayered printed wiring board. Therefore, the present disclosure also provides a photosensitive resin composition for interlayer insulating layer.

In the case where the photosensitive resin composition is referred to in this specification, the photosensitive resin composition for photo via formation and the photosensitive resin composition for interlayer insulating layer are also included.

Note that the photosensitive resin composition of this embodiment is useful as a negative type photosensitive resin composition.

Hereinafter, the respective components which can be contained in the photosensitive resin composition of this embodiment will be described in detail.

<(A) Photopolymerizable Compound Having Ethylenically Unsaturated Group>

The photosensitive resin composition of this embodiment includes a photopolymerizable compound having an ethylenically unsaturated group as the component (A) from the viewpoint of adhesion strength to plated copper. Examples of the ethylenically unsaturated group which the component (A) has include a vinyl group, an allyl group, a propargyl group, a butenyl group, an ethynyl group, a phenylethynyl group, a maleimide group, a nadimide group, and a (meth)acryloyl group. The ethylenically unsaturated group is preferably the (meth)acryloyl group.

In this embodiment, the component (A) includes "(A1) a photopolymerizable compound having an acidic substituent group and an alicyclic structure together with an ethylenically unsaturated group". Since the component (A) includes the component (A1), a photosensitive resin composition which is excellent in resolution of via, adhesion strength to plated copper, electrical insulation reliability, and desmear resistance is provided.

Hereinafter, the details will be described in order from the component (A1).

((A1) Photopolymerizable Compound Having Acidic Substituent and Alicyclic Structure together with Ethylenically Unsaturated Group)

Examples of the ethylenically unsaturated group which the component (A1) has include the same groups as those for the ethylenically unsaturated group as mentioned above. At least one selected from the group consisting of a vinyl group, an allyl group, a propargyl group, a butenyl group, an ethynyl group, a phenylethynyl group, a maleimide group, a nadimide group, and a (meth)acryloyl group is preferred; a vinyl group, an allyl group, and a (meth)acryloyl group are more preferred; and a (meth)acryloyl group is still more preferred.

As the acidic substituent which the component (A1) has, for example, at least one selected from the group consisting of a carboxy group, a sulfonic acid group, a phenolic hydroxy group, and the like is preferred, and a carboxy group is more preferred.

From the viewpoint of resolution of via, adhesion strength to plated copper, electrical insulation reliability, and desmear resistance, the alicyclic structure which the component (A1) has is preferably an alicyclic structure having a ring-forming carbon number of 5 to 20, more preferably an alicyclic structure having a ring-forming carbon number of 5 to 18, still more preferably an alicyclic structure having a ring-forming carbon number of 6 to 18, especially preferably an alicyclic structure having a ring-forming carbon number of 8 to 14, and most preferably an alicyclic structure having a ring-forming carbon number of 8 to 12.

Further, from the viewpoint of resolution of via, adhesion strength to plated copper, electrical insulation reliability, and desmear resistance, the alicyclic structure is preferably composed of 2 or more rings, more preferably composed of 2 to 4 rings, and still more preferably composed of 3 rings. Examples of the alicyclic structure composed of one ring include a cyclohexane structure and a cyclohexene structure. Further, examples of the alicyclic structure composed of 2 or more rings include a norbornane structure, a decalin structure, a bicycloundecane structure, and a saturated dicyclopentadiene structure.

From the viewpoint of resolution of via, adhesion strength to plated copper, electrical insulation reliability, and desmear resistance, the alicyclic structure is preferably a saturated dicyclopentadiene structure, and more preferably an alicyclic structure (saturated dicyclopentadiene structure) represented by the following general formula (a).

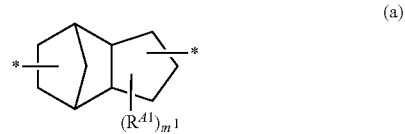

(a)

In the general formula (a), $R^{41}$ represents an alkyl group having 1 to 12 carbon atoms and may be substituted in any site in the alicyclic structure; $m^1$ is an integer of 0 to 6; and * is a binding site to other structure.

In the general formula (a), examples of the alkyl group having 1 to 12 carbon atoms, which is represented by $R^{41}$, include a methyl group, an ethyl group, a n-propyl group, an isopropyl group, a n-butyl group, an isobutyl group, a t-butyl group, and a n-pentyl group. The alkyl group is preferably an alkyl group having 1 to 6 carbon atoms, more preferably an alkyl group having 1 to 3 carbon atoms, and still more preferably a methyl group.

$m^1$ is an integer of 0 to 6, preferably an integer of 0 to 2, and more preferably 0.

In the case where $m^1$ is an integer of 2 to 6, plural $R^{41}$'s may be the same as or different from each other. Furthermore, plural $R^{41}$'s may be substituted on the same carbon atom within a possible range or may be substituted on a different carbon atom from each other.

* is a binding site to other structure, and binding may be made by any carbon atom on the alicyclic structure; however, bindings are preferably made by the carbon atom expressed by 1 or 2 and the carbon atom expressed by 3 to 5 in the following general formula (a').

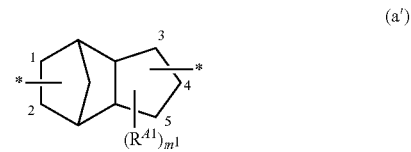

(a')

In the general formula (a'), $R^{41}$, $m^1$, and * are the same as those in the general formula (a).

Examples of the component (A1) include:

"(A1-1) an acid-modified ethylenically unsaturated group and alicyclic structure-containing epoxy derivative" obtained by allowing a compound [hereinafter occasionally referred to as a component (A')] resulting from modifying an alicyclic structure-containing epoxy resin (a1) with an ethylenically unsaturated group-containing organic acid (a2) to react with a saturated group or an unsaturated group-containing polybasic acid anhydride (a3); and "(A1-2) an acid-modified ethylenically unsaturated group and alicyclic structure-containing phenol novolak or cresol novolak resin" obtained by allowing a modified novolak type epoxy resin resulting from addition polymerization of phenol novolak resin or cresol novolak resin with at least one selected from the group consisting of ethylene oxide and propylene oxide to react with the ethylenically unsaturated group-containing organic acid (a2), and an alicyclic structure-containing and saturated group or unsaturated group-containing polybasic acid anhydride (a4).

The component (A1) is preferably "(A1-1) the acid-modified ethylenically unsaturated group and alicyclic structure-containing epoxy derivative" obtained by allowing a compound [component (A')] resulting from modifying the alicyclic structure-containing epoxy resin (a1) with the ethylenically unsaturated group-containing organic acid (a2) to react with saturated group or unsaturated group-containing polybasic acid anhydride (a3), from the viewpoint of being capable of alkaline development and being excellent in resolution of via, adhesion strength to plated copper, electrical insulation reliability, and desmear resistance.

First, raw materials that can be used for the production of "(A-1) the acid-modified ethylenically unsaturated group and alicyclic structure-containing epoxy derivative" will be described in detail.

(a1) Alicyclic Structure-Containing Epoxy Resin

The alicyclic structure-containing epoxy resin (a1) is preferably an epoxy resin having two or more epoxy groups. The epoxy resin is classified into a glycidyl ether type epoxy resin, a glycidyl amine type epoxy resin, a glycidyl ester type epoxy resin, and the like. Of these, the glycidyl ether type epoxy resin is preferred.

In this embodiment, at least an alicyclic structure-containing epoxy resin is used as the epoxy resin. The alicyclic structure is explained in the same manner as the alicyclic structure which the component (A1) has, and a preferred aspect thereof is also the same.

The alicyclic structure-containing epoxy resin (a1) is preferably an epoxy resin represented by the following general formula (a1-1). In addition, an epoxy resin having a structural unit represented by the following general formula (a1-2) is also preferred.

other, in that case, n is represented by an average value of the mixture. n is preferably 2 to 10.

As the alicyclic structure-containing epoxy resin (a1), a commercially available product may be used. Examples of the commercially available product include XD-1000 (trade name, manufactured by Nippon Kayaku Co., Ltd.); and EPICLON HP-7200L, EPICLON HP-7200, EPICLON HP-7200HH, and EPICLON HP-7200HHH (trade names, manufactured by DIC Corporation; "EPICLON" is a registered trademark).

As the epoxy resin (a1), other epoxy resin than the aforementioned epoxy resin having an alicyclic structure (hereinafter occasionally referred to as "other epoxy resin")

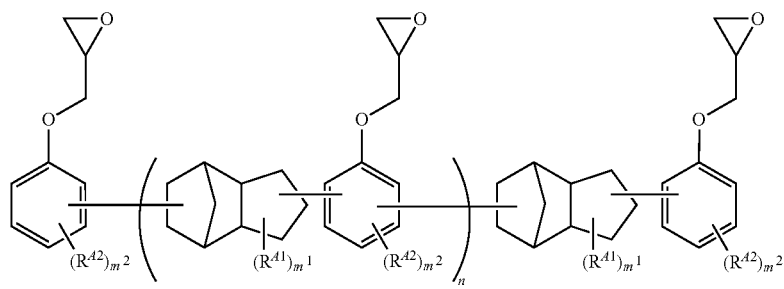 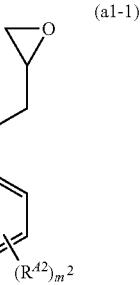

(a1-1)

In the general formula (a1-1), $R^{A1}$ represents an alkyl group having 1 to 12 carbon atoms and may be substituted in any site in the alicyclic structure; $R^{A2}$ represents an alkyl group having 1 to 12 carbon atoms; $m^1$ is an integer of 0 to 6; $m^2$ is an integer of 0 to 3; and n is 0 to 10.

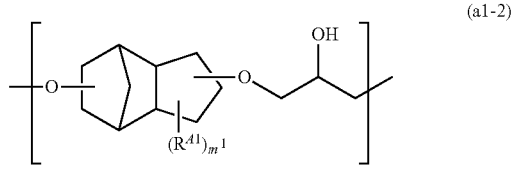

(a1-2)

In the general formula (a1-2), $R^{A1}$ represents an alkyl group having 1 to 12 carbon atoms and may be substituted in any site in the alicyclic structure; and $m^1$ is an integer of 0 to 6.

In the general formula (a1-1) and the general formula (a1-2), $R^{A1}$ is the same as $R^{A1}$ in the general formula (a), and a preferred aspect thereof is also the same.

Examples of the alkyl group having 1 to 12 carbon atoms, which is represented by $R^{A1}$ in the general formula (a1-1), include a methyl group, an ethyl group, a n-propyl group, an isopropyl group, a n-butyl group, an isobutyl group, a t-butyl group, and a n-pentyl group. The alkyl group is preferably an alkyl group having 1 to 6 carbon atoms, more preferably an alkyl group having 1 to 3 carbon atoms, and still more preferably a methyl group.

$m^1$ in the general formula (a1-1) and the general formula (a1-2) is the same as $m^1$ in the general formula (a), and a preferred aspect thereof is also the same.

$m^2$ in the general formula (a1-1) is an integer of 0 to 3, preferably 0 or 1, and more preferably 0. n in the general formula (a1-1) represents the number of structural units within the parenthesis and is 0 to 10. In general, since the epoxy resin is a mixture of compounds having a different number of structural units within the parenthesis from each may be used in combination. Examples of the other epoxy resin include bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the aforementioned bisphenol-based novolak type epoxy resins, such as a phenol novolak type epoxy resin, a cresol novolak type epoxy resin, and a biphenyl novolak type epoxy resin; phenol aralkyl type epoxy resins; biphenyl aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; xylylene type epoxy resins; dihydroanthracene type epoxy resins; aliphatic chain epoxy resins; and rubber-modified epoxy resins.

(a2) Ethylenically Unsaturated Group-Containing Organic Acid

Although the ethylenically unsaturated group-containing organic acid (a2) is not particularly restricted, it is preferably an ethylenically unsaturated group-containing monocarboxylic acid. The ethylenically unsaturated group is the same as the ethylenically unsaturated group described above for the component (A1).

Examples of the ethylenically unsaturated group-containing monocarboxylic acid include acrylic acid; acrylic acid derivatives, such as a dimer of acrylic acid, methacrylic acid, β-furfurylacrylic acid, β-styrylacrylic acid, cinnamic acid, crotonic acid, and α-cyanocinnamic acid; half ester compounds that are a reaction product between a hydroxy group-containing acrylate and a dibasic acid anhydride; and half ester compounds that are a reaction product between an ethylenically unsaturated group-containing monoglycidyl ether or an ethylenically unsaturated group-containing monoglycidyl ester and a dibasic acid anhydride. Of these, acrylic acid is preferred.

The component (a2) may be used alone or may be used in combination of two or more thereof.

The half ester compound is, for example, obtained by allowing a hydroxy group-containing acrylate, an ethylenically unsaturated group-containing monoglycidyl ether, or an ethylenically unsaturated group-containing monoglycidyl ester to react with a dibasic acid anhydride in an equimolar ratio.

Examples of the hydroxy group-containing acrylate, the ethylenically unsaturated group-containing monoglycidyl ether, and the ethylenically unsaturated group-containing monoglycidyl ester, each of which is used for synthesis of the half ester compound that is an example of the component (a2), include hydroxyethyl acrylate, hydroxyethyl methacrylate, hydroxypropyl acrylate, hydroxypropyl methacrylate, hydroxybutyl acrylate, hydroxybutyl methacrylate, polyethylene glycol monoacrylate, polyethylene glycol monomethacrylate, trimethylolpropane diacrylate, trimethylolpropane dimethacrylate, pentaerythritol triacrylate, pentaerythritol trimethacrylate, dipentaerythritol pentaacrylate, pentaerythritol pentamethacrylate, glycidyl acrylate, and glycidyl dimethacrylate.

The dibasic acid anhydride which is used for synthesis of the half ester compound may be either one containing a saturated group or one containing an unsaturated group. Examples of the dibasic acid anhydride include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride.

Although there is no particular limitation, in the reaction between the component (a1) and the component (a2), it is preferable to perform the reaction in a ratio such that the component (a2) is 0.6 to 1.05 equivalents relative to 1 equivalent of the epoxy group of the component (a1), and the reaction may be performed such that the foregoing ratio is 0.8 to 1.0 equivalent. By performing the reaction in such a ratio, there is a tendency that the photopolymerizability is improved, namely the photosensitivity increases, and the resolution of via is improved.

The component (a1) and the component (a2) can be reacted upon being dissolved in an organic solvent.

Examples of the organic solvent include: ketones such as methyl ethyl ketone and cyclohexanone; aromatic hydrocarbons such as toluene, xylene, and tetramethylbenzene; glycol ether-based compounds such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and carbitol acetate; aliphatic hydrocarbons such as octane and decane; and petroleum-based solvents such as petroleum ether, petroleum naphtha, hydrogenated petroleum naphtha, and solvent naphtha.

Furthermore, in order to promote the reaction between the component (a1) and the component (a2), it is preferable to use a catalyst. Examples of the catalyst include: amine-based catalysts such as triethylamine and benzyl methylamine; quaternary ammonium salt catalysts such as methyltriethylammonium chloride, benzyltrimethylammonium chloride, benzyltrimethylammonium bromide, and benzyltrimethylammonium iodide; and phosphine-based catalysts such as triphenyl phosphine. Of these, phosphine-based catalysts are preferred, and triphenyl phosphine is more preferred.

A use amount of the catalyst is preferably 0.01 to 10 parts by mass, more preferably 0.05 to 5 parts by mass, and still more preferably 0.1 to 2 parts by mass based on 100 parts by mass of the total of the component (a1) and the component (a2). When the use amount falls within the aforementioned range, there is a tendency that the reaction between the component (a1) and the component (a2) is promoted.

For the purpose of preventing polymerization during the reaction from occurring, it is preferable to use a polymerization inhibitor. Examples of the polymerization inhibitor include hydroquinone, methyl hydroquinone, hydroquinone monomethyl ether, catechol, and pyrogallol.

In the case of using the polymerization inhibitor, from the viewpoint of improving the storage stability of the composition, a use amount thereof is preferably 0.01 to 1 part by mass, more preferably 0.02 to 0.8 parts by mass, and still more preferably 0.05 to 0.5 parts by mass based on 100 parts by mass of the total of the component (a1) and the component (a2).

From the viewpoint of productivity a reaction temperature between the component (a1) and the component (a2) is preferably 60 to 150° C., more preferably 70 to 120° C., and still more preferably 80 to 110° C.

In the light of the above, it may be conjectured that the component (A') which is obtained by allowing the component (a1) and the component (a2) to react with each other is a compound having a hydroxy group formed through a ring-opening addition reaction between the epoxy group of the component (a1) and the carboxy group of the component (a2).

(a3) Polybasic Acid Anhydride

The component (a3) may be one containing a saturated group or may be one containing an unsaturated group. Examples of the component (a3) include succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahydrophthalic anhydride, ethylhexahydrophthalic anhydride, and itaconic anhydride. Of these, tetrahydrophthalic anhydride is preferred from the viewpoint of resolution of via.

It may be conjectured that by further allowing the above-obtained component (A') to react with the component (a3) containing a saturated or unsaturated group, "(A1-1) the acid-modified ethylenically unsaturated group and alicyclic structure-containing epoxy derivative" in which the hydroxy group of the component (A') (also including the hydoxy group originally existing in the component (a1)) and the acid anhydride group of the component (a3) are half-esterified is formed.

In the reaction between the component (A') and the component (a3), for example, by reacting 0.1 to 1.0 equivalent of the compound (a3) relative to one equivalent of the hydroxy group in the component (A'), the acid value of the acid-modified ethylenically unsaturated group and alicyclic structure-containing epoxy derivative (A1-1) can be controlled.

The acid value of the acid-modified ethylenically unsaturated group and alicyclic structure-containing epoxy derivative (A1-1) is preferably 20 to 150 mgKOH/g, more preferably 30 to 120 mgKOH/g, and still more preferably 40 to 100 mgKOH/g. When the acid value is 20 mgKOH/g or more, there is a tendency that the solubility of the photosensitive resin composition in a dilute alkaline solution is excellent, and when it is 150 mgKOH/g or less, there is a tendency that the electric characteristics of the cured film are improved.

From the viewpoint of productivity a reaction temperature between the component (A') and the component (a3) is preferably 50 to 150° C., more preferably 60 to 120° C., and still more preferably 70 to 100° C.

In the light of the above, although the photopolymerizable compound (A1) having an acidic substituent and an alicyclic structure together with an ethylenically unsaturated group is not particularly restricted, it is preferably represented by the following general formula (A-1).

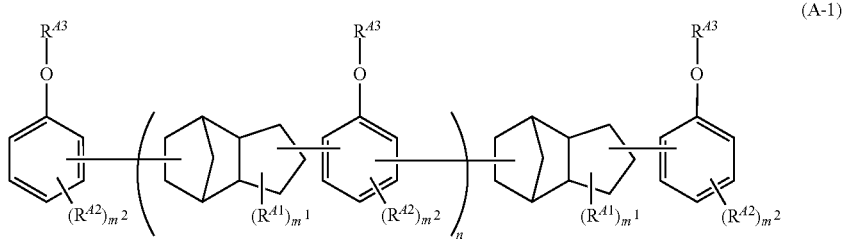

(A-1)

In the general formula (A-1), $R^{A1}$ represents an alkyl group having 1 to 12 carbon atoms and may be substituted in any site in the alicyclic structure; $R^{A2}$ represents an alkyl group having 1 to 12 carbon atoms; $R^{A3}$ is an organic group having an ethylenically unsaturated group, an organic group having an ethylenically unsaturated group and an acidic substituent, or a glycidyl group, and at least one $R^{A3}$ is an organic group having an ethylenically unsaturated group and an acidic substituent; $m^1$ is an integer of 0 to 6; $m^2$ is an integer of 0 to 3; and n is 0 to 10.

$R^{A1}$, $R^{A2}$, $m^1$, $m^2$, and n in the general formula (A-1) are the same as those in the general formula (a1-1), and preferred aspects thereof are also the same.

Although $R^{A3}$ is the same as defined above, the glycidyl group in the general formula (a1-1) is corresponding to the site formed through the reaction between the component (a2) and the component (a3) while being defined taking into consideration the matter that a part of the glycidyl group is unreacted. Specifically the "organic group having an ethylenically unsaturated group" that is a choice for $R^{A3}$ is a group derived from the component (a2), and the "organic group having an ethylenically unsaturated group and an acidic substituent" that is a choice for $R^{A3}$ is a group derived from the components (a2) and (a3). That is, when the components (a2) and (a3) react with all of the glycidyl groups in the general formula (a1-1), $R^{A3}$ becomes the "organic group having an ethylenically unsaturated group and an acidic substituent", whereas the site in which the glycidyl group reacts only with the component (a2) becomes the "organic group having an ethylenically unsaturated group", and the site in which the glycidyl group does not react with any of the components (a2) and (a3) becomes the "glycidyl group".

Next, raw materials that can be used for the production of the "acid-modified ethylenically unsaturated group and alicyclic structure-containing phenol novolak or cresol novolak resin (A1-2)" will be briefly described.

One of the raw materials is the modified novolak type epoxy resin obtained by addition polymerization of phenol novolak resin or cresol novolak resin with at least one selected from the group consisting of ethylene oxide and propylene oxide. It is preferable to use a catalyst for the addition polymerization, and examples of the catalyst include metallic sodium, sodium methoxide, sodium hydroxide, potassium hydroxide, sodium carbonate, potassium carbonate, sodium phenolate, and various Lewis acids.

Weight average molecular weights of the phenol novolak resin and the cresol novolak resin are not particularly restricted, but are preferably 500 to 30,000, and more preferably 1,000 to 10,000. Note that in the present specification, the weight average molecular weight (and a number average molecular weight) is a value obtained in terms of standard polystyrene by a gel permeation chromatography (GPC) method using tetrahydrofuran as a solvent, and more specifically, it is a value measured according to a method described later.

The reaction temperature in the addition polymerization is not particularly restricted, but can be carried out in the range of 60 to 230° C.

For the addition polymerization, a known method may be used or applied, and the method is not limited by the above method.

By the above addition polymerization, the modified novolak type epoxy resin can be obtained.

The "ethylenically unsaturated group-containing organic acid (a2)" to be reacted with the modified novolak type epoxy resin obtained above will be described in the same manner as the above-mentioned ethylenically unsaturated group-containing organic acid (a2).

Further, as the alicyclic structure contained in the "alicyclic structure-containing and saturated group or unsaturated group-containing polybasic acid anhydride (a4)" to be reacted with the modified novolak type epoxy resin obtained above, an alicyclic structure having a ring-forming carbon number of 5 to 20 is preferred, an alicyclic structure having a ring-forming carbon number of 5 to 15 is more preferred, an alicyclic structure having a ring-forming carbon number of 5 to 10 is still more preferred, and an alicyclic structure having a ring-forming carbon number of 5 to 8 is especially preferred. The alicyclic structure may be one ring or two or more rings, but is preferably one ring. As the alicyclic structure, a cyclohexane structure, a cyclohexene structure or the like is preferred, and a cyclohexene structure is more preferred.

Examples of the "alicyclic structure-containing and saturated group or unsaturated group-containing polybasic acid anhydride (a4)" include tetrahydrophthalic anhydride, phthalic anhydride, methyltetrahydrophthalic anhydride, ethyltetrahydrophthalic anhydride, hexahydrophthalic anhydride, methylhexahydrophthalic anhydride, and ethylhexahydrophthalic anhydride. Of these, tetrahydrophthalic anhydride and phthalic anhydride are preferred, and tetrahydrophthalic anhydride is more preferred.

The conditions for allowing the modified novolak type epoxy resin to react with the ethylenically unsaturated group-containing organic acid (a2) and the alicyclic structure-containing and saturated group or unsaturated group-containing polybasic acid anhydride (a4) are not particularly restricted. For example, there is a method of reacting the modified novolak type epoxy resin with the component (a2) at 20 to 100° C. and then with the component (a4) at 20 to 100° C., in the presence of catalyst as needed.

(Molecular Weight of Photopolymerizable Compound (A1) Having Acidic Substituent and Alicyclic Structure together with Ethylenically Unsaturated Group)

A weight average molecular weight (Mw) of the component (A1) is preferably 1,000 to 30,000, more preferably 2,000 to 25,000, and still more preferably 3,000 to 18,000. When the weight average molecular weight falls within this range, the adhesion strength to the plated copper, the heat resistance, and the electrical insulation reliability are improved. In particular, it is preferred that the weight average molecular weight (Mw) of the acid-modified ethylenically unsaturated group and alicyclic structure-containing epoxy derivative (A1-1) is within the above range. Here, the weight average molecular weight (and the number average molecular weight) is a value measured using a calibration curve of standard polystyrene with a gel permeation chromatography (GPC) (manufactured by Tosoh Corporation), and in more detail, it is a value measured according to a method described below.

<Measurement Method of Weight Average Molecular Weight and Number Average Molecular Weight>

As for the weight average molecular weight and the number average molecular weight, a value obtained by performing the measurement using a GPC measurement apparatus as mentioned below and under a measurement condition as also mentioned below and converting the measured value using a calibration curve of standard polystyrene was defined as the weight average molecular weight or the number average molecular weight. In addition, for preparing the calibration curve, 5 sample sets of standard polystyrene ("PStQuick MP-H" and "PStQuick B", manufactured by Tosoh Corporation) were used.

(GPC Measurement Apparatus)

GPC apparatus: High-speed GPC apparatus "HCL-8320GPC", with a differential refractometer or UV as the detector, manufactured by Tosoh Corporation Column: Column TSKgel SuperMultipore HZ-H (column length: 15 cm, column inner diameter: 4.6 mm), manufactured by Tosoh Corporation (Measurement Condition)
Solvent: Tetrahydrofuran (THF)
Measurement temperature: 40° C.
Flow rate: 0.35 mL/min
Sample concentration: 10 mg/5 mL of THF
Injection volume: 20 μL ((A2-1) Acid-Modified Ethylenically Unsaturated Group-Containing Epoxy Derivative Not Containing Alicyclic Structure)

The photopolymerizable compound (A) having an ethylenically unsaturated group may also be an aspect further including "(A2-1) an acid-modified ethylenically unsaturated group-containing epoxy derivative not containing an alicyclic structure" which is obtained by allowing a compound resulting from modifying an epoxy resin (a21) (however, an epoxy resin not containing an alicyclic structure) with an ethylenically unsaturated group-containing organic acid (a22) to react with a saturated group or unsaturated group-containing polybasic acid anhydride (a23).

The epoxy resin (a21) is not particularly restricted so long as it is an epoxy resin not containing an alicyclic structure, and examples thereof include a glycidyl ether type epoxy resin, a glycidyl amine type epoxy resin, and a glycidyl ester type epoxy resin. Of these, a glycidyl ether type epoxy resin is preferred.

The epoxy resin (a21) is classified into various epoxy resins depending upon a difference of the main structure, and in the epoxy resins of respective types, the epoxy resin is further classified as follows. Specifically the epoxy resin is classified into bisphenol-based epoxy resins, such as a bisphenol A type epoxy resin, a bisphenol F type epoxy resin, and a bisphenol S type epoxy resin; bisphenol-based novolak type epoxy resins, such as a bisphenol A novolak type epoxy resin and a bisphenol F novolak type epoxy resin; novolak type epoxy resins other than the aforementioned bisphenol-based novolak type epoxy resins, such as a phenol novolak type epoxy resin, a cresol novolak type epoxy resin, and a biphenyl novolak type epoxy resin; phenol aralkyl type epoxy resins; stilbene type epoxy resins; naphthalene structure-containing type epoxy resins, such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; biphenyl aralkyl type epoxy resins; xylylene type epoxy resins; dihydroanthracene type epoxy resins; aliphatic chain epoxy resins; rubber-modified epoxy resins; and the like. Of these, bisphenol-based novolak type epoxy resins are preferred, and a bisphenol F novolak type epoxy resin is more preferred.

The ethylenically unsaturated group-containing organic acid (a22) and the saturated group or unsaturated group-containing polybasic acid anhydride (a23) are respectively the same as those described above for the ethylenically unsaturated group-containing organic acid (a2) and the saturated group or unsaturated group-containing polybasic acid anhydride (a3), and preferred aspects thereof are also the same.

In addition, a method for allowing the compound resulting from modifying the component (a21) with the component (a22) to react with the component (a23) can be referred to the method for allowing the compound resulting from modifying the component (a1) with the component (a2) to react with the component (a3).

As the acid-modified ethylenically unsaturated group-containing epoxy derivative not containing an alicyclic structure (A2-1), a commercially available product may be used. Examples of the commercially available product include CCR-1218H, CCR-1159H, CCR-1222H, PCR-1050, TCR-1335H, ZAR-1035, ZAR-2001H, UXE-3024, ZFR-1185, ZCR-1569H, ZXR-1807, ZCR-6000, and ZCR-8000 (trade names, manufactured by Nippon Kayaku Co., Ltd.); and UE-9000, UE-EXP-2810PM, and UE-EXP-3045 (trade names, manufactured by DIC Corporation).

In the case where the component (A) contains both the component (A1) (or the component (A1-1)) and the component (A2-1), from the viewpoint of a balance among characteristics, such as resolution of via, adhesion strength to plated copper, electrical insulation reliability, and desmear resistance, a content ratio [((A1) or (A1-1))/(A2-1)] of the component (A1) (or the component (A1-1)) to the component (A2-1) is preferably 20/80 to 99/1, more preferably 50/50 to 99/1, still more preferably 60/40 to 99/1, especially preferably 60/40 to 85/15, and most preferably 65/35 to 80/20 in terms of a mass ratio.

((A2-2) Styrene-Maleic Acid-based Resin)

As the photopolymerizable compound (A) having an ethylenically unsaturated group, "(A2-2) a styrene-maleic acid-based resin" such as a hydroxyethyl (meth)acrylate modified product of a styrene-maleic anhydride copolymer, can also be used in combination. The component (A2-2) does not contain an alicyclic structure. The component (A2-2) may be used alone or may be used in combination of two or more thereof.

((A2-3) Epoxy-based Polyurethane Resin)

As the photopolymerizable compound (A) having an ethylenically unsaturated group, "(A2-3) an epoxy-based polyurethane resin", which is obtained by allowing a compound resulting from modifying the epoxy resin (a21) with the ethylenically unsaturated group-containing organic acid (a22) (for example, the component (A')) to react with an isocyanate compound, can also be used in combination. The component (A2-3) does not contain an alicyclic structure. The component (A2-3) may be used alone or may be used in combination of two or more thereof.

(Component (A) other than Those mentioned above)

As for the photopolymerizable compound (A) having an ethylenically unsaturated group, from the viewpoint of enhancing the chemical resistance after curing (exposure) to increase a difference in developer resistance between an exposed area and an unexposed area, the following aspects are preferred. That is, an aspect is preferred in which the photopolymerizable compound (A) having an ethylenically unsaturated group includes at least one selected from the group consisting of (Ai) a monofunctional vinyl monomer having one polymerizable ethylenically unsaturated group, (Aii) a bifunctional vinyl monomer having two polymerizable ethylenically unsaturated groups, and (Aiii) a polyfunctional vinyl monomer having at least three polymerizable ethylenically unsaturated groups, and an aspect is more preferred in which the photopolymerizable compound (A) includes the component (Aiii). The components (Ai) to (Aiii) are preferably ones having a molecular weight of 1,000 or less. However, in this embodiment, the components (Ai) to (Aiii) do not include the component (A) described above.

((Ai) Monofunctional Vinyl Monomer)

Examples of the monofunctional vinyl monomer having one polymerizable ethylenically unsaturated group include (meth)acrylic acid and a (meth)acrylic acid alkyl ester. Examples of the (meth)acrylic acid alkyl ester include methyl (meth)acrylate, ethyl (meth)acrylate, butyl (meth)acrylate, 2-ethylhexyl (meth)acrylate, and hydroxyethyl (meth)acrylate. The component (Ai) maybe used alone or may be used in combination of two or more thereof.

((Aii) Bifunctional Vinyl Monomer)

Examples of the bifunctional vinyl monomer having two polymerizable ethylenically unsaturated groups include polyethylene glycol di(meth)acrylate, trimethylolpropane di(meth)acrylate, polypropylene glycol di(meth)acrylate, 2,2-bis(4-(meth)acryloxypolyethoxypolypropoxyphenyl) propane, and bisphenol A diglycidyl ether di(meth)acrylate. The component (Aii) may be used alone or may be used in combination of two or more thereof.

((Aiii) Polyfunctional Vinyl Monomer)

Examples of the polyfunctional vinyl monomer having at least three polymerizable ethylenically unsaturated groups include: (meth)acrylate compounds having a trimethylolpropane-derived structure, such as trimethylolpropane tri(meth)acrylate; (meth)acrylate compounds having a tetramethylolmethane-derived structure, such as tetramethylolmethane tri(meth)acrylate and tetramethylolmethane tetra(meth)acrylate; (meth)acrylate compounds having a pentaerythritol-derived structure, such as pentaerythritol tri(meth)acrylate and pentaerythritol tetra(meth)acrylate; (meth)acrylate compounds having a dipentaerythritol-derived structure, such as dipentaerythritol penta(meth)acrylate and dipentaerythritol hexa(meth)acrylate; (meth)acrylate compounds having a ditrimethylolpropane-derived structure, such as ditrimethylolpropane tetra(meth)acrylate; and (meth)acrylate compounds having a diglycerin-derived structure. Of these, from the viewpoint of enhancing the chemical resistance after curing (exposure) to increase a difference in developer resistance between an exposed area and an unexposed area, (meth)acrylate compounds having a dipentaerythritol-derived structure are preferred, and dipentaerythritol penta(meth)acrylate is more preferred. The component (Aiii) may be used alone or may be used in combination of two or more thereof.

Here, the term "(meth)acrylate compound having an XXX-derived structure" (however, "XXX" is a compound name) means an esterified product between XXX and (meth)acrylic acid, and a compound modified with an alkylene oxy group is also included in the esterified product.

(Content of Component (A))

Although the content (total content) of the component (A) is not particularly restricted, from the viewpoint of heat resistance, electrical characteristics, and chemical resistance, it is preferably 0.1 to 60% by mass, more preferably 0.1 to 55% by mass, still more preferably 1 to 50% by mass, especially preferably 5 to 45% by mass, most preferably 15 to 45% by mass, and may be 30 to 45% by mass, based on the total solid content of the photosensitive resin composition.

Although the component (A) is not particularly restricted, from the viewpoint of photosensitive characteristics, it is preferable to use the component (A1) in combination with the component (Aiii). In this case, a content proportion [(A1)/(Aiii)](mass ratio) of the component (A1) to the component (Aiii) is preferably 2 to 20, more preferably 2 to 15, still more preferably 2.5 to 10, and especially preferably 3 to 6.

From the viewpoint of resolution of via, adhesion strength to plated copper, electrical insulation reliability, and desmear resistance, a content ratio of the component (A1) to the total amount of the component (A) is preferably 20 to 95% by mass, more preferably 40 to 95% by mass, still more preferably 65 to 95% by mass, and especially preferably 70 to 95% by mass, and may be 80 to 95% by mass, or may be 80 to 90% by mass.

<(B) Photopolymerization Initiator>

The component (B) which is used in this embodiment is not particularly restricted so long as it is able to polymerize the component (A), and it can be appropriately selected from typically used photopolymerization initiators.

Examples of the component (B) include: benzoin-based compounds such as benzoin, benzoin methyl ether, and benzoin isopropyl ether; acetophenone-based compounds such as acetophenone, 2,2-dimethoxy-2-phenylacetophenone, 2,2-diethoxy-2-phenylacetophenone, 1,1-dichloroacetophenone, 1-hydroxycyclohexylphenyl ketone, 2-benzyl-2-dimethylamino-1-(4-morpholinophenyl)-1-butanone, 2-methyl-1-[4-(methylthio)phenyl]-2-morpholino-1-propanone, and N,N-dimethylaminoacetophenone; anthraquinone-based compounds such as 2-methylanthraquinone, 2-ethylanthraquinone, 2-tert-butylanthraquinone, 1-chloroanthraquinone, 2-amylanthraquinone, and 2-aminoanthraquinone; thioxanthone-based compounds such as 2,4-dimethylthioxanthone, 2,4-diethylthioxanthone, 2-chlorothioxanthone, and 2,4-diisopropylthioxanthone; ketal-based compounds such as acetophenone dimethyl ketal and benzyldimethyl ketal; benzophenone-based compounds such as benzophenone, methylbenzophenone, 4,4'-dichlorobenzophenone, 4,4'-bis(diethylamino)benzophenone, Michler's ketone, and 4-benzoyl-4'-methyldiphenyl sulfide; acridine-based compounds such as 9-phenylacridine and 1,7-bis(9,9'-acridinyl)heptane; acyl phosphine oxide-based compounds such as 2,4,6-trimethylbenzoyldiphenyl phosphine oxide; and oxime ester-based compounds such as 1,2-octanedione-1-[4-(phenylthio)phenyl]-2-(O-benzoyloxime), 1-[9-ethyl-6-(2-methylbenzoyl)-9H-carbazol-3-yl] ethanone 1-(0-acetyloxime), and 1-phenyl-1,2-propanedione-2-[O-ethoxycarbonyl]oxime]. Of these, acetophenone-based compounds and thioxanthone-based compounds are preferred, and 2-methyl-1-[4-(methylthio) phenyl]-2-morpholino-1-propanone and 2,4-diethylthioxanthone are more preferred. The acetophenone-based compounds have such an advantage that they are hardly volatilized and hardly become outgas, and the thioxanthone-based compounds have such an advantage that they are able to be photo-cured even in a visible light region.

The component (B) may be used alone or may be used in combination of two or more thereof. In the case of using two or more compounds in combination, it is preferable to use an acetophenone-based compound and a thioxanthone-based compound in combination, and it is more preferred to use 2-methyl-1-[4-(methylthio)phenyl]-2-morpholino-1-propanone and 2,4-diethylthioxanthone in combination.

(Content of Component (B))

Although the content of the component (B) is not particularly restricted, it is preferably 0.1 to 15% by mass, more preferably 0.15 to 5% by mass, still more preferably 0.15 to 1.5% by mass, and especially preferably 0.20 to 1.2% by mass based on the total solid content of the photosensitive resin composition. When the content of the component (B) is 0.1% by mass or more, in the interlayer insulating layer to be formed using the photosensitive resin composition, there is a tendency that a possibility in which an exposed site eluates during the development is reduced, and when it is 15% by mass or less, there is a tendency that the heat resistance is improved.

<(B') Photopolymerization Initiator>

The photosensitive resin composition of this embodiment may contain (B') a photopolymerization initiator together with the component (B). Examples of the photopolymerization initiator (B') include tertiary amines such as ethyl N,N-dimethylaminobenzoate, isoamyl N,N-dimethylaminobenzoate, pentyl-4-dimethylaminobenzoate, triethylamine, and triethanolamine. The component (B') may be used alone or may be used in combination of two or more thereof.

In the case where the photosensitive resin composition of this embodiment contains the component (B'), the content thereof is preferably 0.01 to 20% by mass, more preferably 0.2 to 5% by mass, and still more preferably 0.3 to 2% by mass based on the total amount of the resin components of the photosensitive resin composition. The photosensitive resin composition of this embodiment may not contain the component (B').

<(C) Thermosetting Resin>

The photosensitive resin composition of this embodiment may further contain a thermosetting resin as the component (C), and the thermosetting resin is preferably contained. The compound corresponding to the component (A) is not included in the component (C), and in that respect, it can be said that the component (C) does not have an ethylenically unsaturated group. The ethylenically unsaturated group referred to here is described in the same manner as the ethylenically unsaturated group contained in the component (A). In addition, a substance (epoxy-modified polybutadiene or the like) having an epoxy group, which satisfies the condition that it does not have the ethylenically unsaturated group, is included in the component (C).

Since the photosensitive resin composition of this embodiment contains the thermosetting resin (C), in addition to improvements in adhesion strength to plated copper and insulation reliability, there is a tendency that the heat resistance is improved.

Examples of the thermosetting resin include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. In addition, the thermosetting resin is not particularly restricted to these resins, and known thermosetting resins can be used. Of these, an epoxy resin is preferred.

The component (C) may be used alone or may be used in combination of two or more thereof.

The epoxy resin is preferably an epoxy resin having two or more epoxy groups. The epoxy resin is classified into a glycidyl ether type epoxy resin, a glycidyl amine type epoxy resin, a glycidyl ester type epoxy resin, and the like. Of these, a glycidyl ether type epoxy resin is preferred.

Further, the epoxy resin is classified into various epoxy resins depending upon a difference of the main structure, and in the aforementioned epoxy resins of respective types, the epoxy resin is further classified as follows. Specifically, the epoxy resin is classified into: bisphenol-based epoxy resins such as a bisphenol A type epoxy resin, a bisphenol F type epoxy resin, and a bisphenol S type epoxy resin; bisphenol-based novolak type epoxy resins such as a bisphenol A novolak type epoxy resin and a bisphenol F novolak type epoxy resin; novolak type epoxy resins other than the aforementioned bisphenol-based novolak type epoxy resins, such as a phenol novolak type epoxy resin, a cresol novolak type epoxy resin, and a biphenyl novolak type epoxy resin; phenol aralkyl type epoxy resins; stilbene type epoxy resins; naphthalene structure-containing type epoxy resins such as a naphthalene type epoxy resin, a naphthol novolak type epoxy resin, a naphthol type epoxy resin, a naphthol aralkyl type epoxy resin, and a naphthylene ether type epoxy resin; biphenyl type epoxy resins; biphenyl aralkyl type epoxy resins; xylylene type epoxy resins; dihydroanthracene type epoxy resins; alicyclic epoxy resins such as a dicyclopentadiene type epoxy resin; heterocyclic epoxy resins; spiro ring-containing epoxy resins; cyclohexanedimethanol type epoxy resins; trimethylol type epoxy resins; aliphatic chain epoxy resins; rubber-modified epoxy resins; and the like.

The component (C) may be used alone or may be used in combination of two or more thereof.

Of these, in particular, from the viewpoint of heat resistance, electrical insulation reliability, and adhesion strength to plated copper, bisphenol-based epoxy resins, naphthol type epoxy resins, naphthalene type epoxy resins, biphenyl type epoxy resins, naphthylene ether type epoxy resins, and cresol novolak type epoxy resins are preferred; a bisphenol A type epoxy resin, a bisphenol F type epoxy resin, and a biphenyl type epoxy resin are more preferred; a bisphenol F type epoxy resin and a biphenyl type epoxy resin are still more preferred; and a biphenyl type epoxy resin is especially preferred.

As for these, commercially available products can be used. Examples thereof include a bisphenol A type epoxy resin ("jER828EL" and "YL980", manufactured by Mitsubishi Chemical Corporation), a bisphenol F type epoxy resin ("iER806H" and "YL983U", manufactured by Mitsubishi Chemical Corporation), a naphthalene type epoxy resin ("HP4032D" and "HP4710", manufactured by DIC Corporation), a naphthalene structure-containing type polyfunctional epoxy resin ("NC7000" manufactured by Nippon Kayaku Co., Ltd.), a naphthol type epoxy resin ("ESN-475V" manufactured by NIPPON STEEL Chemical & Material Co., Ltd.), an epoxy resin having a biphenyl structure ("NC3000H" and "NC3500", manufactured by Nippon Kayaku Co., Ltd., and "YX4000HK" and "YL6121", manufactured by Mitsubishi Chemical Corporation), an anthracene type epoxy resin ("YX8800" manufactured by Mitsubishi Chemical Corporation), a glycerol type epoxy resin ("ZX1542" manufactured by NIPPON STEEL Chemical & Material Co., Ltd.), a naphthylene ether type epoxy resin ("EXA7311-G4" manufactured by DIC Corporation), and a cresol novolak type epoxy resin ("EPICLON N-680" manufactured by DIC Corporation).

As the epoxy resin of the component (C), an epoxy-modified polybutadiene can be used in addition to those exemplified above. In particular, as for the component (C), from the viewpoint of handling properties during production of a printed wiring board, it is preferable to use an aromatic epoxy resin that is solid at room temperature and an epoxy resin that is liquid at room temperature in combination. From this viewpoint, an aspect is preferred in which the aforementioned epoxy resin exemplified as a preferred epoxy resin (the aromatic epoxy resin that is solid at room temperature) is used in combination with the epoxy-modified polybutadiene (the epoxy resin that is liquid at room temperature). In this case, a content ratio of the both to be used in combination [(aromatic epoxy resin that is solid at room temperature)/(epoxy resin that is liquid at room temperature)] is preferably 95/5 to 60/40, more preferably 95/5 to 70/30, and still more preferably 95/5 to 80/20 in terms of a mass ratio.

The epoxy-modified polybutadiene is preferably one having a hydroxy group at a molecular terminal, more preferably one having a hydroxy group at both molecular terminals, and still more preferably one having a hydroxy group at only both molecular terminals. In addition, although there is no particular restriction so long as the number of hydroxy group which the epoxy-modified polybutadiene has is 1 or more, it is preferably 1 to 5, more preferably 1 or 2, and still more preferably 2.

From the viewpoint of adhesion strength to plated copper, heat resistance, thermal expansion coefficient, and softness, the epoxy-modified polybutadiene is preferably an epoxy-modified polybutadiene represented by the following general formula (C-1).

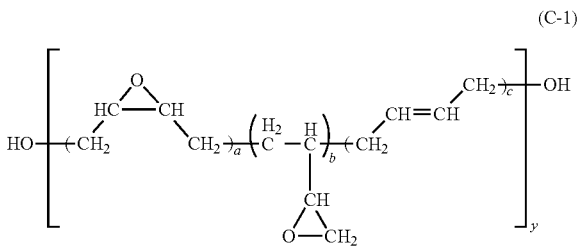

(C-1)

In the formula (C-1), a, b, and c each represent a ratio of the structural unit within the parenthesis; a is 0.05 to 0.40, b is 0.02 to 0.30, c is 0.30 to 0.80; a, b, and c satisfy (a+b+c)=1.00 and (a+c)>b; and y represents a number of the structural unit within the square bracket and is an integer of 10 to 250.

In the general formula (C-1), the binding order of the respective structural units within the square bracket is in any order. That is, the structural unit expressed in the left, the structural unit expressed in the center, and the structural unit expressed in the right may be in any order, and when they are respectively expressed as (a), (b), and (c), there may be various binding orders, such as -[(a)-(b)-(c)]-[(a)-(b)-(c)-]-, -[(a)-(c)-(b)]-[(a)-(c)-(b)-]-, -[(b)-(a)-(c)]-[(b)-(a)-(c)-]-, -[(a)-(b)-(c)]-[(c)-(b)-(a)-]-, -[(a)-(b)-(a)]-[(c)-(b)-(c)-]-, and -[(c)-(b)-(c)]-[(b)-(a)-(a)-]-.

From the viewpoint of adhesion strength to plated copper, heat resistance, thermal expansion coefficient, and softness, a is preferably 0.10 to 0.30, b is preferably 0.10 to 0.30, and c is preferably 0.40 to 0.80. In addition, from the same viewpoint, y is preferably an integer of 30 to 180.

In the general formula (C-1), examples of a commercially available product of the epoxidized polybutadiene in which a is 0.20, b is 0.20, c is 0.60, and y is an integer of 10 to 250 include "EPOLEAD (registered trademark) PB3600" (manufactured by Daicel Corporation).

(Content of Component (C))

In the case where the photosensitive resin composition of this embodiment contains the component (C), although the content thereof is not particularly restricted, it is preferably 5 to 70% by mass, more preferably 5 to 40% by mass, still more preferably 7 to 30% by mass, and especially preferably 10 to 30% by mass based on the total solid content of the photosensitive resin composition. When the content of the component (C) is 5% by mass or more, sufficient crosslinking of the photosensitive resin composition is obtained, and there is a tendency that the adhesion strength to plated copper and the electrical insulation reliability are improved. On the other hand, when it is 70% by mass or less, there is a tendency that the resolution of via is favorable.

<(D) Elastomer>

The photosensitive resin composition of this embodiment may or may not contain an elastomer as the component (D), and it preferably contains the elastomer. Since the photosensitive resin composition contains the component (D), there is a tendency that a photosensitive resin composition which is excellent in resolution of via, adhesion strength to plated copper, and electrical insulation reliability is provided. In addition, due to the component (D), there is also brought an effect for inhibiting reduction in flexibility and adhesion strength to plated copper to be caused due to a strain (internal stress) inside a cured product through curing shrinkage of the component (A).

The component (D) is preferably an elastomer that is liquid at 25° C.

The component (D) may be used alone or may be used in combination of two or more thereof.

Examples of the elastomer include a styrene-based elastomer, an olefin-based elastomer, a polyester-based elastomer, a urethane-based elastomer, a polyamide-based elastomer, an acrylic elastomer, and a silicone-based elastomer, and it is preferable to use at least one selected from these elastomers. Such an elastomer includes a hard segment component and a soft segment component, and there is a tendency that the former contributes to the heat resistance and the strength, whereas there is a tendency that the latter contributes to the softness and the toughness.

Among the above-exemplified elastomers, from the viewpoint of compatibility solubility, and adhesion strength to plated copper, the component (D) preferably includes at least one selected from the group consisting of an olefin-based elastomer, a polyester-based elastomer, and a urethane-based elastomer, and more preferably includes a polyester-based elastomer. In addition, the component (D) is still more preferably at least one selected from the group consisting of an olefin-based elastomer, a polyester-based elastomer, and a urethane-based elastomer, and is especially preferably a polyester-based elastomer.
(Styrene-Based Elastomer)

Examples of the styrene-based elastomer include a styrene-butadiene-styrene block copolymer, a styrene-isoprene-styrene block copolymer, a styrene-ethylene-butylene-styrene block copolymer, and a styrene-ethylene-propylene-styrene block copolymer. The styrene-based elastomer may be used alone or may be used in combination of two or more thereof.

Examples of a component constituting the styrene-based elastomer include: styrene; and styrene derivatives such as a-methylstyrene, 3-methylstyrene, 4-propylstyrene, and 4-cyclohexylstyrene.

The styrene-based elastomer is preferably one having a number average molecular weight of 1,000 to 50,000, and more preferably one having a number average molecular weight of 3,000 to 20,000.

In this specification, the number average molecular weight is a value expressed in terms of standard polystyrene by the gel permeation chromatography (GPC) with tetrahydrofuran as a solvent.

As the styrene-based elastomer, a commercially available product can also be used.
(Olefin-Based Elastomer)

The olefin-based elastomer is a polymer or copolymer of an α-olefin having 2 to 20 carbon atoms, such as ethylene, propylene, 1-butene, 1-hexene, and 4-methyl-pentene. Note that the olefin-based elastomer may be one having a hydroxy group at a molecular terminal and is preferably one having a hydroxy group at a molecular terminal. The olefin-based elastomer may be used alone or may be used in combination of two or more thereof.

Suitable examples of the olefin-based elastomer include polyethylene, polybutadiene, a hydroxy group-containing polybutadiene, a hydroxy group-containing polyisopropylene, an ethylene-propylene copolymer (EPR), and an ethylene-propylene-diene copolymer (EPDM). In addition, the suitable examples also include a copolymer of the α-olefin having 2 to 20 carbon atoms with a non-conjugated diene having 2 to 20 carbon atoms, such as dicyclopentadiene, 1,4-hexadiene, cyclooctadiene, methylene norbornene, ethylidene norbornene, butadiene, and isoprene. Furthermore, the suitable examples also include a carboxy-modified NBR resulting from copolymerizing a butadiene-acrylonitrile copolymer with methacrylic acid.

The olefin-based elastomer is preferably one having a number average molecular weight of 1,000 to 8,000, and more preferably one having a number average molecular weight of 1,500 to 6,500.

As the olefin-based elastomer, a commercially available product can also be used.
(Polyester-Based Elastomer)

Examples of the polyester-based elastomer include ones obtained by polycondensing a dicarboxylic acid or a derivative thereof with a diol compound or a derivative thereof. The polyester-based elastomer may be used alone or may be used in combination of two or more thereof.

Examples of the dicarboxylic acid include: aromatic dicarboxylic acids such as terephthalic acid, isophthalic acid, and naphthalene dicarboxylic acid; aromatic dicarboxylic acids resulting from substituting a hydrogen atom of the aromatic dicarboxylic acid with a methyl group, an ethyl group, a phenyl group, or the like; aliphatic dicarboxylic acids having 2 to 20 carbon atoms, such as adipic acid, sebacic acid, and dodecane dicarboxylic acid; and alicyclic dicarboxylic acids such as cyclohexane dicarboxylic acid. As for the dicarboxylic acid, from the viewpoint of adhesion to a substrate, it is also preferred to use a dimer acid derived from a natural product. The dicarboxylic acid may be used alone or may be used in combination of two or more thereof.

Examples of the derivative of the dicarboxylic acid include anhydrides of the dicarboxylic acids.

Examples of the diol compound include: aliphatic diols such as ethylene glycol, 1,3-propanediol, 1,4-butanediol, 1,6-hexanediol, and 1,10-decanediol; alicyclic diols such as 1,4-cyclohexane diol; and aromatic diols represented by the following general formula (D-1). The diol compound may be used alone or may be used in combination of two or more thereof.

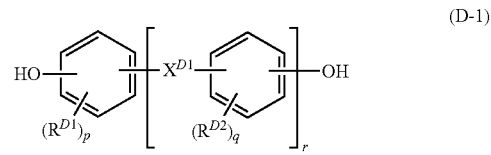

(D-1)

In the general formula (D-1), $X^{D1}$ represents an alkylene group having 1 to 10 carbon atoms, an alkylidene group having 2 to 10 carbon atoms, a cycloalkylene group having 4 to 8 carbon atoms, —O—, —S—, or —SO$_2$—; $R^{D1}$ and $R^{D2}$ each independently represent a halogen atom or an alkyl group having 1 to 12 carbon atoms; p and q are each independently an integer of 0 to 4; and r is 0 or 1.

In the general formula (D-1), examples of the alkylene group having 1 to 10 carbon atoms, which is represented by $X^{D1}$, include a methylene group, a 1,2-dimethylene group, a 1,3-trimethylene group, a 1,4-tetramethylene group, and a 1,5-pentamethylene group. From the viewpoint of resolution of via, adhesion strength to plated copper, and electrical insulation reliability, the alkylene group is preferably an alkylene group having 1 to 3 carbon atoms, and more preferably a methylene group.

Examples of the alkylidene group having 2 to 10 carbon atoms, which is represented by $X^{D1}$, include an ethylidene group, a propylidene group, an isopropylidene group, a butylidene group, an isobutylidene group, a pentylidene group, and an isopentylidene group. From the viewpoint of resolution of via, adhesion strength to plated copper, and electrical insulation reliability, the alkylidene group is preferably an isopropylidene group.

Examples of the cycloalkylene group having 4 to 8 carbon atoms, which is represented by $X^{D1}$, include a cyclopentylene group, a cyclohexylene group, and a cyclooctylene group.

Among the foregoing, $X^{D1}$ is preferably an alkylene group having 1 to 10 carbon atoms or an alkylidene group having 2 to 10 carbon atoms, and more preferably a methylene group or an isopropylidene group.

In the general formula (D-1), examples of the halogen atom which is represented by $R^{D1}$ and $R^{D2}$ include a fluorine atom, a chlorine atom, a bromine atom, and an iodine atom.

Examples of the alkyl group having 1 to 12 carbon atoms, which is represented by $R^{D1}$ and $R^{D2}$, include a methyl group, an ethyl group, a n-propyl group, an isopropyl group, a n-butyl group, an isobutyl group, a t-butyl group, and a n-pentyl group. The alkyl group is preferably an alkyl group having 1 to 6 carbon atoms, more preferably an alkyl group having 1 to 3 carbon atoms, and still more preferably a methyl group.

p and q are each independently an integer of 0 to 4, and each preferably 0 or 1.

r is 0 or 1, and although it may be any of these, when r is 0, the diol compound has a structure represented by the following general formula (D-1').

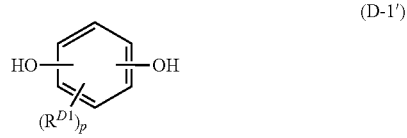

(D-1')

In the general formula (D-1'), $X^{D1}$, $R^{D1}$, and p are the same as those in the general formula (D-1), and preferred aspects thereof are also the same.

Examples of the aromatic diol represented by the general formula (D-1) include bisphenol A, bis(4-hydroxyphenyl)methane, bis(4-hydroxy-3-methylphenyl)propane, and resorcin.

Furthermore, as the polyester-based elastomer, a multi-block copolymer containing an aromatic polyester (for example, polybutylene terephthalate) moiety as a hard segment component and an aliphatic polyester (for example, polytetramethylene glycol) moiety as a soft segment component can also be used, and it is preferable to use the multi-block copolymer. As the multi-block copolymer, there are commercially available products of various grades depending upon differences in the type, the ratio, and the molecular weight of the hard segment and the soft segment. Specifically examples thereof include "HYTREL (registered trademark)" (manufactured by DU PONT-TORAY CO., LTD.), "PELPRENE (registered trademark)" (manufactured by Toyobo Co., Ltd.), and "ESPEL (registered trademark)" and "Teslac (registered trademark)" (manufactured by Showa Denko Materials Co., Ltd.).

The polyester-based elastomer is preferably one having a number average molecular weight of 900 to 30,000, more preferably one having a number average molecular weight of 1,000 to 25,000, and still more preferably one having a number average molecular weight of 5,000 to 20,000.

(Urethane-Based Elastomer)

Suitable examples of the urethane-based elastomer include ones containing a hard segment including a short-chain diol and a diisocyanate and a soft segment including a high-molecular (long-chain) diol and a diisocyanate. The urethane-based elastomer may be used alone or may be used in combination of two or more thereof.

Examples of the high-molecular (long-chain) diol include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene-neopentylene adipate). The number average molecular weight of the high-molecular (long-chain) diol is preferably 500 to 10,000.

Examples of the short-chain diol include ethylene glycol, propylene glycol, 1,4-butanediol, and bisphenol A. The number average molecular weight of the short-chain diol is preferably 48 to 500.

The urethane-based elastomer is preferably one having a number average molecular weight of 1,000 to 25,000, more preferably one having a number average molecular weight of 1,500 to 20,000, and still more preferably one having a number average molecular weight of 2,000 to 15,000.

As the urethane-based elastomer, a commercially available product can be used.

(Polyamide-Based Elastomer)

The polyamide-based elastomer is roughly classified into two types of a polyether block amide type in which a polyamide is used as the hard segment, and a polyether is used as the soft segment; and a polyether ester block amide type in which a polyamide is used as the hard segment, and a polyester is used as the soft segment.

Specific examples of the polyamide-based elastomer include block copolymers in which a polyamide is used as the hard segment component, and polybutadiene, a butadiene-acrylonitrile copolymer, a styrene-butadiene copolymer, polyisoprene, an ethylene-propylene copolymer, a polyether, a polyester, polybutadiene, a polycarbonate, a polyacrylate, a polymethacrylate, a polyurethane, a silicone rubber, or the like is used as the soft segment component. The polyamide-based elastomer may be used alone or may be used in combination of two or more thereof.

The polyamide-based elastomer is preferably one having a number average molecular weight of 1,000 to 50,000, and more preferably one having a number average molecular weight of 2,000 to 30,000.

As the polyamide-based elastomer, a commercially available product can be used.

(Acrylic Elastomer)

Examples of the acrylic elastomer include polymers of a raw material monomer containing an acrylic ester as a main component. Suitable examples of the acrylic ester include ethyl acrylate, butyl acrylate, methoxyethyl acrylate, and ethoxyethyl acrylate. In addition, elastomers resulting from copolymerizing, as a crosslinking point monomer, glycidyl methacrylate, allyl glycidyl ether, or the like may be used, and further elastomers resulting from copolymerizing acrylonitrile, ethylene, or the like may be used. Specifically examples thereof include an acrylonitrile-butyl acrylate copolymer, an acrylonitrile-butyl acrylate-ethyl acrylate copolymer, and an acrylonitrile-butyl acrylate-glycidyl methacrylate copolymer. The acrylic elastomer may be used alone or may be used in combination of two or more thereof.

The acrylic elastomer is preferably one having a number average molecular weight of 1,000 to 50,000, and more preferably one having a number average molecular weight of 2,000 to 30,000.

As the acrylic elastomer, a commercially available product can be used.

(Silicone-Based Elastomer)

The silicone-based elastomer is an elastomer containing an organopolysiloxane as a main component, and for example, it is classified into a polydimethylsiloxane-based elastomer, a polymethylphenylsiloxane-based elastomer, a polydiphenylsiloxane-based elastomer, and the like. The silicone-based elastomer may be used alone or may be used in combination of two or more thereof.

The silicone-based elastomer is preferably one having a number average molecular weight of 1,000 to 50,000, and more preferably one having a number average molecular weight of 2,000 to 30,000.

As the silicone-based elastomer, a commercially available product can be used.

(Other Elastomers)

Further, the component (D) may also be an aspect including at least one selected from the group consisting of a polyphenylene ether resin, a phenoxy resin, a polycarbonate resin, a polyamide-imide resin, a polyimide resin, a xylene resin, a polyphenylene sulfide resin, a polyether imide resin, a polyetheretherketone resin, a tetrafluoroethylene resin, a polyacrylonitrile resin, a maleic anhydride-modified polybutadiene, a phenol-modified polybutadiene, and a carboxy-modified polyacrylonitrile.

(Content of Component (D))

In the case where the photosensitive resin composition of this embodiment contains the component (D), the content thereof is preferably 0.5 to 20% by mass, more preferably 0.5 to 15% by mass, still more preferably 0.5 to 10% by mass, especially preferably 1.0 to 6% by mass, and most preferably 1.0 to 4.0% by mass based on the total solid content of the photosensitive resin composition. When the content of the component (D) is 0.5% by mass or more, there is a tendency that not only the effect for improving the adhesion strength to the plated copper is sufficient, but also the electrical insulation reliability is further improved. When the content of the component (D) is 20% by mass or less, there is a tendency that all of the resolution of via, the adhesion strength to the plated copper, and the electrical insulation reliability are satisfied.

<(E) Thermal Polymerization Initiator>

The photosensitive resin composition of this embodiment may or may not contain a thermal polymerization initiator as the component (E).

Although the thermal polymerization initiator is not particularly restricted, examples thereof include: hydroperoxides such as diisopropylbenzene hydroperoxide "PERCUMYL P" (trade name, manufactured by NOF Corporation (hereinafter the same)), cumene hydroperoxide "PERCUMYL H", and t-butyl hydroperoxide "PERBUTYL H"; dialkyl peroxides, such as α,α-bis(t-butyl peroxy-m-isopropyl)benzene "PERBUTYL P", dicumyl peroxide "PERCUMYL D", 2,5-dimethyl-2,5-bis(t-butyl peroxy) hexane "PERHEXA 25B?", t-butyl cumyl peroxide "PERBUTYL C", di-t-butyl peroxide "PERBUTYL D", 2,5-dimethyl-2,5-bis(t-butyl peroxy)hexyne-3 "PERHEXYNE 25B?", and t-butyl peroxy-2-ethyl hexanoate "PERBUTYL O"; ketone peroxides; peroxy ketals such as n-butyl 4,4-di-(t-butyl peroxy)valerate "PERHEXA V"; diacyl peroxides; peroxy dicarbonates; organic oxides such as a peroxy ester; and azo compounds such as 2,2'-azobisisobutyro nitrile, 2,2'-azobis(2-cyclopropyl propionitrile), and 2,2'-azobis(2, 4-dimethyl valeronitrile). Of these, from the viewpoint that the photopolymerizability is not hindered and the effect for improving the physical properties and characteristics of the photosensitive resin composition is large, dialkyl peroxides are preferred, and 2,5-dimethyl-2,5-bis(t-butyl peroxy) hexyne-3 is more preferred.

The thermal polymerization initiator may be used alone or may be used in combination of two or more thereof.

(Content of Component (E))

In the case where the photosensitive resin composition of this embodiment contains the component (E), although the content thereof is not particularly restricted, it is preferably 0.01 to 5% by mass, more preferably 0.02 to 3% by mass, and still more preferably 0.03 to 2% by mass based on the total amount of the resin components of the photosensitive resin composition. When the content of the component (E) is 0.01% by mass or more, there is a tendency that the thermal curing can be sufficiently performed, and when it is 5% by mass or less, there is a tendency that the photosensitive characteristics and the heat resistance are favorable.

<(F) Inorganic Filler>

The photosensitive resin composition of this embodiment contains an inorganic filler as the component (F). The inorganic filler (F) contained in the photosensitive resin composition of this embodiment is one containing an inorganic filler (hereinafter referred to as an inorganic filler (F1)) surface-treated with a coupling agent without at least one functional group selected from the group consisting of an amino group and a (meth)acryloyl group. Here, as for the "coupling agent without at least one functional group selected from the group consisting of an amino group and a (meth)acryloyl group", the coupling agent having an amino group does not fall under this category and the coupling agent having a (meta)acryloyl group does not fall under this category, and of course, the coupling agent having both an amino group and a (meth)acryloyl group also do not fall under this category. When the coupling agent used for the surface treatment of the inorganic filler has an amino group or a (meth)acryloyl group as a functional group, the adhesive strength to the plated copper is particularly reduced.

From the viewpoint of a balance among characteristics, such as resolution of via, adhesion strength to plated copper, electrical insulation reliability and desmear resistance, the coupling agent is preferably one having a group containing an alkoxy group, and more preferably one having a group containing at least one selected from the group consisting of a methoxy group and an ethoxy group. Examples of the alkoxy group include a methoxy group, an ethoxy group, a propoxy group, and a butoxy group. The group containing the alkoxy group may be the alkoxy group itself.

Note that the photosensitive resin composition of this embodiment may contain, as the inorganic filler (F), at least one selected from the group consisting of an inorganic filler (hereinafter referred to as an inorganic filler (F2)) surface-treated with a coupling agent having at least one functional group selected from the group consisting of an amino group and a (meth)acryloyl group and an inorganic filler (hereinafter referred to as an inorganic filler (F3)) not surface-treated, in addition to the inorganic filler (F1). However, from the viewpoint of the effect of the inorganic filler (F1), the content of the inorganic filler (F1) based on the total amount of the inorganic filler (F) is preferably 50% by mass or more, preferably 70% by mass or more, still more preferably 80% by mass or more, and especially preferably 90% by mass or more (all include 100% by mass).

Since the photosensitive resin composition contains the inorganic filler, the thermal-expansion reduction can be achieved, and there is less possibility to generate warpage. In the thermosetting resin composition which has hitherto been used as the interlayer insulting layer of the multilayered printed wiring board, it has been contemplated to achieve the thermal-expansion reduction by containing the inorganic filler. However, when the inorganic filler is contained in the photosensitive resin composition, the inorganic filler causes light scattering and hinders the development, and thus, it was difficult to achieve the thermal-expansion reduction by containing a large amount of the inorganic filler. In this way with respect to the matter of containing the inorganic filler, a new problem own to the photosensitive resin composition exists. However, the photosensitive resin composition of this embodiment tends to maintain high resolution of via even when it contains the inorganic filler. Accordingly so far as the photosensitive resin composition of this embodiment is concerned, it is also possible to achieve both the thermal-expansion reduction and the high resolution of via.

Further, in the photosensitive resin composition of this embodiment, since the component (F) contains the inorganic filler (F1), there is also a tendency that a high level of the adhesive strength to the plated copper can be obtained, and further a high level of crack resistance can be obtained.

It is premised that the coupling agent used for the surface treatment of the inorganic filler (F1) does not have at least one functional group selected from the group consisting of an amino group and a (meth)acryloyl group. Examples thereof include a silane coupling agent, a titanium coupling agent, a zirconium coupling agent, and an aluminum coupling agent. Of these, the silane coupling agent is preferred from the viewpoint of insulating property As such a coupling agent, a commercially available product can be used. Examples of the commercially available product include: KBM-13, KBM-22, KBE-13, KBE-22, KBM-1003, KBE-1003, KBM-303, KBM-402, KBM-403, KBE-402, KBM-1403, KBE-1003, and KBM-303, which are Shin-Etsu Silicone (registered trademark) series manufactured by Shin-Etsu Chemical Co., Ltd.; and ZA-45, ZA-65, TA-8, TA-21, AL-3001, which are Orgatix (registered trademark) series manufactured by Matsumoto Fine Chemical Co., Ltd.

The inorganic filler treated with the coupling agent may be blended into the photosensitive resin composition of this embodiment, or by separately blending an untreated inorganic filler and the coupling agent into the photosensitive resin composition of this embodiment (so-called integral blending method), the inorganic filler may be treated with the coupling agent in the photosensitive resin composition. From the viewpoint of avoiding reduction in crack resistance due to the remaining coupling agent, it is preferable to use the inorganic filler treated with the coupling agent.

(Surface Treatment Method for Inorganic Filler)

Note that a method for treating the inorganic filler with the coupling agent is not particularly restricted, and a known method can be used. For example, if necessary the coupling agent is dissolved in a solvent (for example, a mixed solvent of alcohol such as methanol and water) to prepare a coupling agent solution, and preferably 500 to 10,000 parts by mass (more preferably 1,000 to 7,000 parts by mass, still more preferably 1,500 to 5,000 parts by mass) in terms of coupling agent of the coupling agent solution is mixed with 100 parts by mass of the untreated inorganic filler, mixed and stirred with a stirrer, then heat-treated preferably at 80 to 130° C. for 1 to 10 hours, and then cooled to room temperature. The stirrer is not particularly restricted, and examples thereof include a Henschel mixer, a mixing shaker, a tumbler mixer, a V-type mixer, a double cone type mixer, a ribbon type mixer, a Nauter mixer, and a super mixer. Of these, the Henschel mixer is preferred from the viewpoint of sufficiently surface-treating the inorganic filler.

Examples of the component (F) and the component (F1) include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO \cdot TiO_2$), barium carbonate ($BaCO_3$), magnesium carbonate ($MgCO_3$), aluminum hydroxide ($Al(OH)_3$), magnesium hydroxide ($Mg(OH)_2$), lead titanate ($PbO \cdot TiO_2$), lead zirconate titanate (PZT), lead lanthanum zirconate titanate (PLZT), gallium oxide ($Ga_2O_3$), spinel ($MgO-Al_2O_3$), mullite ($3Al_2O_3 \cdot 2SiO_2$), cordierite ($2MgO \cdot 2Al_2O_3/5SiO_2$), talc ($3MgO \cdot 4SiO_2-H_2O$), aluminum titanate ($TiO_2Al_2O_3$), yttria-containing zirconia ($Y_2O_3 \cdot ZrO_2$), barium silicate ($BaO \cdot 8SiO_2$), boron nitride (BN), calcium carbonate ($CaCO_3$), barium sulfate ($BaSO_4$), calcium sulfate ($CaSO_4$), zinc oxide (ZnO), magnesium titanate ($MgO \cdot TiO_2$), hydrotalcite, mica, fired kaolin, and carbon. The component (F) may be used alone or may be used in combination of two or more thereof.

The component (F) and the component (F1) preferably contain silica, and are more preferably silica, from the viewpoint of heat resistance and thermal-expansion reduction. That is, the component (F) and the component (F1) preferably contain silica surface-treated with the coupling agent.

From the viewpoint of resolution of via, an average particle diameter of the component (F) and the component (F1) is preferably 0.01 to 5 µm, more preferably 0.1 to 3 µm, still more preferably 0.1 to 2 µm, and especially preferably 0.1 to 1 µm. Here, the average particle diameter of the component (F) and the component (F1) is a volume average particle diameter of the inorganic filler in a dispersed state in the photosensitive resin composition and is a value obtained through the following measurement. First, the photosensitive resin composition is diluted (or dissolved) with methyl ethyl ketone 1,000 times, and then particles dispersed in the solvent are measured with a submicron particle analyzer (trade name: N5, manufactured by Beckman Coulter, Inc.) at a refractive index of 1.38 in conformity with International Standard ISO13321, and a particle diameter at an integrated value of 50% (volume basis) in the particle size distribution is defined as the average particle diameter (volume average particle diameter). In addition, with respect to the component (F) which is contained in the photosensitive resin film and the interlayer insulating layer provided on a carrier film, as described above, the average particle diameter can be measured by using the submicron particle analyzer after diluting (or dissolving) it 1,000 times (volume ratio) with the solvent such as methyl ethyl ketone.

(Content of Component (F))

The content of the photosensitive resin composition of this embodiment is not particularly restricted, it is preferably 5 to 80% by mass, more preferably 10 to 60% by mass, and still more preferably 15 to 50% by mass based on the total solid content of the photosensitive resin composition. Further, the content of the component (F) may be 20 to 45% by mass or 10 to 30% by mass based on the total solid content of the photosensitive resin composition. When the content of the component (F) is within the above range, in addition to the effect of the component (F), the mechanical strength, the heat resistance, and the like can be further improved.

<Pigment (G)>

The photosensitive resin composition of this embodiment may or may not contain a pigment as the component (G) according to a desired color for the purpose of controlling the photosensitivity or the like. As the component (G), a colorant developing the desired color may be appropriately selected and used, and preferred examples of the component (G) include known colorants such as phthalocyanine blue, phthalocyanine green, iodine green, diazo yellow, crystal violet, carbon black, and naphthalene black.

(Content of Component (G))

In the case where the photosensitive resin composition of this embodiment contains the component (G), the content thereof is preferably 0.01 to 5% by mass, more preferably 0.03 to 3% by mass, and still more preferably 0.05 to 2% by mass based on the total solid content of the photosensitive resin composition, for example, from the viewpoint of controlling the photosensitivity.

<Curing Agent (H) or Curing Accelerator>

In the photosensitive resin composition of this embodiment, a curing agent or curing accelerator may be contained from the viewpoint of further improving various characteristics such as heat resistance, adhesion strength to plated copper, and chemical resistance. In particular, in the case where the thermosetting resin (C) contains an epoxy resin, it is preferable to contain an epoxy resin curing agent as the curing agent.

Examples of the component (H) include: an active ester-based curing agent; imidazole derivatives such as 2-methylimidazole, 2-ethyl-4-methylimidazole, 1-benzyl-2-methylimidazole, 2-phenylimidazole, and 2-phenyl-4-methyl-5-hydroxymethylimidazole; guanamines such as acetoguanamine and benzoguanamine; polyamines such as diaminodiphenylmethane, m-phenylenediamine, m-xylenediamine, diaminodiphenylsulfone, dicyandiamide, urea, a urea derivative, melamine, and a polybasic hydrazide; organic acid salts and/or epoxy adducts thereof; amine complexes such as boron trifluoride; trizine derivatives such as ethyldiamino-s-triazine, 2,4-diamino-s-triazine, and 2,4-diamino-6-xylyl-s-triazine; tertiary amines such as trimethylamine, N,N-dimethyloctylamine, N-benzyldimethylamine, pyridine, N-methylmorpholine, hexa(N-methyl) melamine, 2,4,6-tris(dimethylaminophenol), tetramethylguanidine, and m-aminophenol; polyphenols such as polyvinyl phenol, polyvinyl phenol bromide, phenol novolak, and an alkylphenol novolak; organic phosphines such as tributyl phosphine, triphenyl phosphine, and tris-2-cyanoethyl phosphine; phosphonium salts such as tri-n-butyl (2,5-dihydroxyphenyl)phosphonium bromide and hexadecyltributylphosphonium chloride; quaternary ammonium salts such as benzyltrimethylammonium chloride and phenyltributylammonium chloride; the aforementioned polybasic acid anhydrides; diphenyliodonium tetrafluoroborate, triphenylsulfonium hexafluoroantimonate, and 2,4,6-triphenylthiopyrylium hexafluorophosphate.

Of these, polyamines are preferred, and melamine is more preferred from the viewpoint of further improving various characteristics such as heat resistance, adhesion strength to plated copper, and chemical resistance.

In the case where the photosensitive resin composition of this embodiment contains the component (H), the content thereof is preferably 0.01 to 20% by mass, more preferably 0.02 to 10% by mass, and still more preferably 0.03 to 3% by mass based on the total amount of the resin components of the photosensitive resin composition.

<Diluent>

If desired, a diluent may be used in the photosensitive resin composition of this embodiment. As the diluent, an organic solvent or the like can be used. Examples of the organic solvent include: ketones such as methyl ethyl ketone and cyclohexanone; aromatic hydrocarbons such as toluene, xylene, and tetramethylbenzene; glycol ether-based compounds such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, propylene glycol monoethyl ether acetate, butyl cellosolve acetate, and carbitol acetate; aliphatic hydrocarbons such as octane and decane; and petroleum-based solvents such as petroleum ether, petroleum naphtha, hydrogenated petroleum naphtha, and solvent naphtha. The diluent may be used alone or may be used in combination of two or more thereof. As the diluent, ketones and esters are preferred, and esters are more preferred.

(Content of Diluent)

The content of the diluent may be appropriately selected such that the concentration of the total solid content in the photosensitive resin composition is preferably 40 to 90% by mass, more preferably 45 to 80% by mass, and still more preferably 45 to 70% by mass. By controlling an amount of the diluent used by the above method, the coatability of the photosensitive resin composition is improved, and a higher-definition pattern can be formed.

<Other Components>

If desired, the photosensitive resin composition of this embodiment can contain various known common additives such as a polymerization inhibitor, for example, hydroquinone, methylhydroquinone, hydroquinone monomethyl ether, catechol, and pyrogallol; a tackifier, for example, bentone and montmorillonite; and a foam stabilizer, for example, silicone-based foam stabilizer, a fluorine-based foam stabilizer, and a vinyl resin-based foam stabilizer; and a silane coupling agent. Furthermore, the photosensitive resin composition may also contain: a flame retardant such as a brominated epoxy compound, an acid-modified brominated epoxy compound, an antimony compound, a phosphate compound of a phosphorus-based compound, an aromatic condensed phosphate ester, and a halogen-containing condensed phosphate ester; and thermoplastic resins such as polyester polyurethane resins.

The photosensitive resin composition of this embodiment can be obtained by kneading and mixing the respective components in a roll mill, a bead mill, or the like.

Here, the photosensitive resin composition of this embodiment may be used in a liquid state or may be used in a film state.

When the photosensitive resin composition is used in a liquid state, although the coating method of the photosensitive resin composition of this embodiment is not particularly restricted, examples thereof include various coating methods such as a printing method, a spin coating method, a spray coating method, a jet dispense method, an ink jet method, and an immersion coating method. Of these, the coating method is appropriately selected from the printing method and the spin coating method from the viewpoint of more easily forming the photosensitive layer.

Further, when the photosensitive resin composition is used in a film state, it can be used, for example, in the form of a photosensitive resin film described later. In this case, the photosensitive layer having a desired thickness can be formed by laminating the photosensitive resin film on the carrier film using a laminator or the like. Note that it is preferable to use it in a film state because the production efficiency of the multilayered printed wiring board is high.

[Photosensitive Resin Film and Photosensitive Resin Film for Interlayer Insulating Layer]

The photosensitive resin film of this embodiment is a photosensitive layer which will later become an interlayer insulating layer and is formed of the photosensitive resin composition of this embodiment. The photosensitive resin film of this embodiment may also be an aspect in which the photosensitive resin film is provided on the carrier film.

Although a thickness (thickness after drying) of the photosensitive resin film (photosensitive layer) is not particularly restricted, it is preferably 1 to 100 µm, more preferably 1 to 50 µm, and still more preferably 5 to 40 µm from the viewpoint of thinning the multilayered printed wiring board.

The photosensitive resin film of this embodiment is obtained, for example, by coating the photosensitive resin composition of this embodiment on the carrier film using a known coating apparatus such as a comma coater, a bar coater, a kiss coater, a roll coater, a gravure coater, and a die coater, followed by drying to form the photosensitive layer which will later become the interlayer insulating layer.

Examples of the carrier film include: polyester films such as a polyethylene terephthalate film and a polybutylene terephthalate film; and polyolefin films such as a polypropylene film and a polyethylene film. Although a thickness of the carrier film may be appropriately selected from a range of 5 to 100 µm, it is preferably 5 to 60 µm, and more preferably 15 to 45 µm.

Further, the photosensitive resin film of this embodiment can also be provided with a protective film on a surface of the photosensitive layer opposite to a surface in contact with the carrier film. As the protective film, for example, a polymer film such as polyethylene, polypropylene, or the like can be used. In addition, a polymer film the same as the aforementioned carrier film may be used, or a different polymer film may also be used.

A coating film to be formed by coating the photosensitive resin composition can be dried, for example, with a hot air dryer or a drier using far-infrared rays or near-infrared rays. A drying temperature is preferably 60 to 150° C., more preferably 70 to 120° C., and still more preferably 80 to 100° C. In addition, a drying time is preferably 1 to 60 minutes, more preferably 2 to 30 minutes, and still more preferably 5 to 20 minutes. The content of the remaining diluent in the photosensitive resin film after drying is preferably 3% by mass or less, more preferably 2% by mass or less, and still more preferably 1% by mass or less from the viewpoint of avoiding the diluent from diffusion in a production process of the multilayered printed wiring board.

Since the photosensitive resin film of this embodiment is excellent in resolution of via, adhesion strength to plated copper, electrical insulation reliability and desmear resistance, it is suitable as the interlayer insulating layer of the multilayered printed wiring board. That is, the present disclosure also provides a photosensitive resin film for interlayer insulating layer. Note that the photosensitive resin film for the interlayer insulating layer can also be referred to as an interlayer insulating photosensitive film.

[Multilayered printed wiring board and Method for Producing Same]

The present disclosure also provides a multilayered printed wiring board containing an interlayer insulating layer to be formed using the photosensitive resin composition or photosensitive resin film of this embodiment. Here, the expression "containing an interlayer insulating layer" includes a case where the interlayer insulating layer is contained as it is, and a case where the interlayer insulating layer is contained in a state after being subjected to, for example, processing such as via formation, various treatments such as roughening treatment, and wiring formation.

The multilayered printed wiring board of this embodiment is not particularly restricted with respect to the method for producing the same so long as it includes a step of forming the interlayer insulating layer using the photosensitive resin composition of this embodiment, and for example, it can be easily produced by the following method for producing the multilayered printed wiring board of this embodiment.

As an example of the preferred aspect of the production method of the multilayered printed wiring board, a method for producing a multilayered printed wiring board using the photosensitive resin film (photosensitive resin film for interlayer insulating layer) of this embodiment will be described while appropriately referring to FIG. 1.

A multilayered printed wiring board 100A can be produced, for example, by a production method including the following (1) to (4):

(1) laminating the photosensitive resin film of this embodiment on one surface or both surfaces of a circuit substrate (hereinafter referred to as a "lamination step (1)");

(2) exposing and developing the photosensitive resin film laminated in the step (1), to form an interlayer insulating layer having a via (hereinafter referred to as a "photo via forming step (2)");

(3) subjecting the via and the interlayer insulating layer to a roughening treatment (hereinafter referred to as a "roughening treatment step (3)"); and (4) forming a circuit pattern on the interlayer insulating layer (hereinafter referred to as a "circuit pattern forming step (4)").

Here, as described above, a predetermined operation may be referred to as an "XX step" in the present specification for convenience, but the XX step is not limited to the aspect specifically described in the present specification.

(Lamination Step (1))

The lamination step (1) is a step of laminating the photosensitive resin film (photosensitive resin film for interlayer insulating layer) on one surface or both surfaces of a circuit substrate (a substrate 101 having a circuit pattern 102) by using a vacuum laminator. Examples of the vacuum laminator include a vacuum applicator manufactured by Nichigo-Morton Co., Ltd., a vacuum pressure type laminator manufactured by Meiki Co., Ltd., a roll type dry coater manufactured by Hitachi, Ltd., and a vacuum laminator manufactured by Showa Denko Materials Electronics Co., Ltd.

In the case where the protective film is provided on the photosensitive resin film, after stripping or removing the protective film, the photosensitive resin film can be laminated by pressure bonding to the circuit substrate while pressurizing and heating in a state of the photosensitive resin film being in contact with the circuit substrate.

The lamination can be carried out, for example, at a pressure bonding temperature of 70 to 130° C. and a pressure bonding pressure of 0.1 to 1.0 MPa under a reduced pressure of an air pressure of 20 mmHg (26.7 hPa) or less after optionally preliminarily heating the photosensitive resin film and the circuit substrate. However, the lamination is not particularly restricted to this condition. In addition, the lamination method may be in a batch mode or may be in a continuous mode with rolls.

Finally, the photosensitive resin film laminated on the circuit substrate (hereinafter occasionally referred to as a photosensitive layer) is cooled to a temperature close to room temperature, to form an interlayer insulating layer 103. The carrier film may be stripped off here or may be stripped off after exposure as mentioned later.

(Photo Via Forming Step (2))

In the photo via forming step (2), at least a part of the photosensitive resin film laminated on the circuit substrate is exposed, followed by performing the development. The portion irradiated with active rays is photo-cured through the exposure, to form a pattern. The exposure method is not particularly restricted, and for example, a method of irradiating imagewise active rays using a negative or positive mask pattern that is called an artwork (mask exposure method) may be adopted, or a method of irradiating imagewise active rays by a direct drawing exposure method such as an LDI (laser direct imaging) exposure method and a DLP (digital light processing) exposure method may be adopted.

As a light source of the active rays, a known light source can be used. Specifically examples of the light source include: gas lasers such as a carbon arc lamp, a mercury vapor arc lamp, a high-pressure mercury lamp, a xenon lamp, and an argon laser; solid lasers such as a YAG laser; and ones of effectively radiating ultraviolet rays or visible light rays, such as a semiconductor laser. Although the exposure amount is appropriately selected depending upon the light source used, the thickness of the photosensitive layer, or the like, for example in the case of irradiation with ultraviolet rays from a high-pressure mercury lamp, when the thickness of the photosensitive layer is 1 to 100 μm, the exposure amount is typically preferably about 10 to 1,000 mJ/cm$^2$, and more preferably 15 to 500 mJ/cm$^2$.

In the development, when an uncured portion of the photosensitive layer is removed from the top of the substrate, an interlayer insulating layer formed of a photo-cured cured product is formed on the substrate.

In the case where the carrier film exists on the photosensitive layer, after removing the carrier film, the removal (development) of the unexposed portion is performed. There are included wet development and dry development regarding the development method, and either of them may be adopted; however, the wet development is widely adopted, and the wet development can also be adopted in this embodiment.

In the case of wet development, the development is performed by a known development method with a developer corresponding to the photosensitive resin composition. Examples of the development method include a dip method, a paddle method, a spray method, blushing, slapping, scrapping, and agitation immersion. Of these, from the viewpoint of improving the resolution of via, the spray method is preferred, and a high-pressure spray method is more preferred as the spray method. The development may be carried out by a single method or may be carried out by a combination of two or more methods.

The constitution of the developer is appropriately selected according to the constitution of the photosensitive resin composition. Examples of the developer include an alkaline aqueous solution, an aqueous developer, and an organic solvent-based developer. Of these, an alkaline aqueous solution is preferred as the developer.

In the photo via forming step (2), after performing the exposure and the development, by optionally performing post UV curing with an exposure amount of about 0.2 to 10 J/cm$^2$ (preferably 0.5 to 5 J/cm$^2$) and post thermal curing at a temperature of about 60 to 250° C. (preferably 120 to 200° C.), the interlayer insulating layer may be further cured, and such is preferred.

There is thus formed an interlayer insulating layer having a via 104. The shape of the via is not particularly restricted, and when it is explained in terms of a cross-sectional shape, examples thereof include a quadrilateral and a reverse trapezoid (the top side is longer than the bottom side). When the shape of the via is explained in terms of a shape seen from the front (direction at which the via bottom is seen), examples thereof include a circle and a quadrilateral. In the formation of the via by the photolithography in this embodiment, the via having a cross-sectional shape of a reverse trapezoid (the top side is longer than the bottom side) can be formed, and in this case, it is preferred because a throwing power on the via wall surface of plated copper is increased.

The size (diameter) of the via formed by the present step can be controlled to 60 μm or less, and it is also possible to control it to less than 40 μm or 30 μm or less. It is possible to make the size smaller than that of a via prepared by laser processing. Although a lower limit of the size (diameter) of the via formed by the present step is not particularly restricted, it may be 15 μm or more or may be 20 μm or more.

However, the size (diameter) of the via formed by the present step is not always limited to 60 μm or less, for example, it may be about 200 μm or less, and for example, it is also possible to arbitrarily select it within a range of 15 to 300 μm.

(Roughening Treatment Step (3))

In the roughening treatment step (3), the via and the surface of the interlayer insulating layer are subjected to a roughening treatment with a roughening liquid. Note that in the case where a smear is generated in the photo via forming step (2), the smear may be removed with the roughening liquid. The roughening treatment can be performed simultaneously with the removal of the smear.

Examples of the roughening liquid include a chromium/sulfuric acid roughening liquid, an alkaline permanganate roughening liquid (for example, a sodium permanganate roughening liquid), and a sodium fluoride/chromium/sulfuric acid roughening liquid.

An uneven anchor is formed on the via and the surface of the interlayer insulating layer through the roughening treatment.

(Circuit Pattern Forming Step (4))

The circuit pattern forming step (4) is a step of forming a circuit pattern on the interlayer insulating layer after the roughening treatment step (3).

From the viewpoint of forming a micro wiring, it is preferable to carry out the formation of the circuit pattern through a semi-additive process. According to the semi-additive process, conduction of the via is performed along with the formation of the circuit pattern.

In the semi-additive process, the via bottom, the via wall surface, and the entire surface of the interlayer insulating layer after the roughening treatment step (3) are subjected to an electroless copper plating treatment using a palladium catalyst or the like, to form a seed layer 105. The seed layer is one for forming a power supply layer for the purpose of performing electrolytic copper plating and is preferably formed in a thickness of about 0.1 to 2.0 μm. When the thickness of the seed layer is 0.1 μm or more, there is a tendency that reduction in connection reliability during electrolytic copper plating can be suppressed, and when it is 2.0 μm or less, it is not needed to increase the etching amount during flash etching of the seed layer between wirings, and there is a tendency that the damage given to the wiring during etching is suppressed.

The electroless copper plating treatment is performed when metallic copper is deposited on the via and the surface of the interlayer insulating layer due to the reaction between a copper ion and a reducing agent.

The electroless plating treatment method and the electroplating treatment method may be performed by known methods and are not particularly restricted. However, the catalyst in the electroless plating treatment step is preferably a palladium-tin mixture catalyst, and a primary particle diameter of the catalyst is preferably 10 nm or less. In addition, as for the plating composition of the electroless plating treatment step, it is preferred that hypophosphorous acid is contained as the reducing agent.

As the electroless copper plating solution, a commercially available product can be used. Examples of the commercially available product include "MSK-DK" manufactured by Atotech Japan K.K.; and "THRU-CUP (registered trademark) PEA ver.4" series manufactured by C. Uyemura & Co., Ltd.

After performing the electroless copper plating treatment, a dry film resist is subjected to thermocompression bonding on the electroless copper plating by using a roll laminator. The thickness of the dry film resist must be made higher than the height of the wiring after electrolytic copper plating, and from this viewpoint, a dry film resist having a thickness of 5 to 30 μm is preferred. As for the dry film resist, for example, "PHOTEC (registered trademark)" series manufactured by Showa Denko Materials Co., Ltd. can be used.

After thermocompression bonding of the dry film resist, for example, the dry film resist is exposed through a mask having a desired wiring pattern drawn therein. The exposure can be performed by using the same apparatus and light source as those which may be used during forming the via on the photosensitive resin film. After the exposure, the carrier film on the dry film resist is stripped off, the unexposed portion is developed with an alkaline aqueous solution to be removed, and a resist pattern 106 is formed. Thereafter, if desired, a work of removing a development residue of the dry film resist using a plasma or the like may be performed.

After the development, by performing electrolytic copper plating, a copper circuit layer 107 is formed and via filling is performed.

After the electrolytic copper plating, the drying film resist is stripped off by using an alkaline aqueous solution or an amine-based stripping agent. After stripping off the dry film resist, removal (flash etching) of the seed layer between the wirings is performed. The flash etching is performed by using an acidic solution of sulfuric acid, hydrogen peroxide, or the like and an oxidative solution. Specifically examples thereof include "SAC", manufactured by JCU Corporation; and "CPE-800", manufactured by Mitsubishi Gas Chemical Company Inc. After the flash etching, if desired, removal of palladium and the like deposited in a portion between the wirings is performed. The removal of palladium can be preferably performed by using an acidic solution of nitric acid, hydrochloric acid, or the like.

After stripping of the dry film resist or flash etching step, a post-baking treatment is preferably performed. According to the post-baking treatment, an unreacted thermosetting component is thoroughly thermally cured, whereby the electrical insulation reliability the curing characteristics, and the adhesion strength to plated copper are improved. Although the thermal curing condition varies with the kind of the resin composition, and the like, it is preferred that the curing temperature is 150 to 240° C., and the curing time is 15 to 100 minutes. According to the post-baking treatment, the general production step of the printed wiring board by the photo via method is accomplished, however, the substrate is produced by repeating this process according to the number of required interlayer insulating layers. Then, a solder resist layer 108 is preferably formed on the outermost layer.

Hereinabove, the method for producing the multilayered printed wiring board in which the via is formed using the photosensitive resin composition of this embodiment has been described. Since the photosensitive resin composition of this embodiment is excellent in pattern resolution, for example, it is also suitable for forming a cavity for the purpose of internally containing a chip, a passive element, or the like. For example, the cavity can be suitably formed in a manner in which in the aforementioned explanation regarding the multilayered printed wiring board, the drawing pattern during exposing the photosensitive resin film to form a pattern is formed into one capable of forming a desired cavity.

Furthermore, the photosensitive resin composition of this embodiment is also useful as a surface protective film of the solder resist or the like.

[Semiconductor Package]

The present disclosure also provides a semiconductor package including the multilayered printed wiring board of this embodiment and a semiconductor element. The semiconductor package of this embodiment can be produced by mounting the semiconductor element such as a semiconductor chip or a memory at a predetermined position of the multilayered printed wiring board of this embodiment and sealing the semiconductor element with a sealing resin or the like.

EXAMPLES

Hereinafter, this embodiment will be described in more detail with reference to Examples, but this embodiment is not limited to these Examples.

Photosensitive resin compositions obtained in Examples 1 to 6 and Comparative Examples 1 to 3 were evaluated with respect to characteristics by the following methods.

[1. Evaluation of Resolution of Via (Pattern 1)]
(1-1) Preparation of Laminate for Evaluation A surface of a copper foil of a substrate for printed wiring board in which a 12 μm-thick copper foil had been laminated on a glass epoxy substrate (trade name: "MCL-E-679", manufactured by Showa Denko Materials Co., Ltd.) was treated with a roughening treatment liquid (trade name: "CZ-8100", manufactured by MEC COMPANY LTD.) and then washed with water, followed by drying to obtain the substrate for printed wiring board having been subjected to the roughening treatment.

Subsequently a protective film was stripped off and removed from "a photosensitive resin film having the carrier film and the protective film stuck thereon" produced in each of Examples and Comparative Examples, and the exposed photosensitive resin film was placed in a state of being in contact with the copper foil of the substrate for printed wiring board having been subjected to the roughening treatment, followed by performing a lamination treatment with a press type vacuum laminator (trade name: "MVLP-500", manufactured by Meiki Co., Ltd.). The condition of the lamination was set such that a press hot plate temperature was 70° C., an evacuation time was 20 seconds, a lamination press time was 30 seconds, an atmospheric pressure was 4 kPa or less, and a pressure bonding pressure was 0.4 MPa. After the lamination treatment, the resultant was allowed to stand at room temperature for one hour or more, to obtain a laminate for evaluation in which the photosensitive resin film and the carrier film were laminated in this order on a copper foil surface of the substrate for printed wiring board.

(1-2) Sensitivity Measurement of Photosensitive Resin Film

After the carrier film of the laminate for evaluation obtained in the above (1-1) was stripped off and removed, a 41-stage step tablet was installed, and exposure was performed using a direct imaging exposure apparatus "DXP-3512" (manufactured by ORC MANUFACTURING CO., LTD.) equipped with an ultrahigh pressure mercury lamp as a light source. Regarding the exposure pattern, a pattern in which dots were arranged in a lattice form ((diameter of dot)/(distance between centers of dots)=1/2) was used. The diameter (φ) of the dot was varied within a range of 30 to 100 μm at a pitch of 5 μm.

After the exposure, the resultant was allowed to stand at room temperature for 30 minutes, and the photosensitive resin composition in an unexposed area was spray-developed with a 1% by mass sodium carbonate aqueous solution at 30° C. for 60 seconds. After the development, an amount of exposure energy with which the number of gloss remaining step stages of the 41-stage step tablet became 8.0 was designated as sensitivity (unit: mJ/cm$^2$) of the photosensitive resin film. Using the pattern exposed at this sensitivity, the resolution of via provided in the photosensitive resin film was evaluated according to the following evaluation criteria.

(1-3) Evaluation of Resolution of Via

Regarding the evaluation of resolution of via, exposure was performed at an amount of exposure energy with the sensitivity of the photosensitive resin film measured in the above (1-2), namely the number of step stages was 8.0; subsequently spray-development was performed; the via pattern was observed with an optical microscope; and the evaluation was performed according to the following criteria. A state expressed by the following term "opened" refers to a state in which during observation of a via portion of a dot pattern with an optical microscope, the copper foil of the substrate for printed wiring board can be observed. The judgement with "A" expresses favorable characteristics.

A: The via portion of p60 μm of the dot pattern is opened.
B: The via portion of p60 μm of the dot pattern is not opened.
C: Not photo-cured.

[2. Evaluation of Adhesion Strength (Stripping Strength) to Plated Copper]

While stripping off the protective film from "the photosensitive resin film having the carrier film and the protective film stuck thereon" produced in each of Examples and Comparative Examples, lamination was performed on a copper-clad laminate substrate having a thickness of 1.0 mm with a press type vacuum laminator (trade name: "MVLP-500", manufactured by Meiki Co., Ltd.) under a condition in which a pressure bonding pressure was 0.4 MPa, a press hot plate temperature was 80° C., an evacuation time was 25 seconds, a lamination press time was 25 seconds, and an atmospheric pressure was 4 kPa or less. There was thus obtained a laminate.

The obtained laminate was subjected to whole image exposure using a parallel light exposure apparatus (trade name: "EXM-1201". manufactured by ORC MANUFACTURING CO., LTD.) equipped with an ultrahigh pressure mercury lamp as a light source at 500 mJ/cm². Subsequently the resultant was exposed with an ultraviolet exposure apparatus at an amount of exposure of 2,000 mJ/cm² and then heated at 170° C. for one hour, to obtain the laminate for evaluation having a cured product (cured film) formed on the copper-clad laminate substrate.

Subsequently first, an aqueous solution containing 200 mL/L of diethylene glycol monobutyl ether and 5 g/L of sodium hydroxide was prepared as a swelling liquid, heated at 70° C., and then the laminate for evaluation was subjected to a dipping treatment for 10 minutes. Subsequently an aqueous solution containing 60 g/L of potassium permanganate and 40 g/L of sodium hydroxide was prepared as a roughening liquid, heated at 70° C., and then the laminate for evaluation was subjected to a dipping treatment for 15 minutes. Subsequently an aqueous solution of a neutralizing liquid (tin chloride ($SnCl_2$): 30 g/L, hydrogen chloride: 300 mL/L) was prepared, heated at 40° C., and then the laminate for evaluation was subjected to a dipping treatment for 5 minutes, to reduce the potassium permanganate. As described above, a surface of the cured product of the laminate for evaluation was subjected to a desmear treatment.

Subsequently the surface of the laminate for evaluation subjected to the desmear treatment was treated with an alkaline cleaner "Cleaner Securigant 902" (trade name, manufactured by Atotech Japan K.K.) at 60° C. for 5 minutes, to perform degreasing and washing. After washing, the desmear-treated cured product was treated with a pre-dip liquid "Pre-dip Neogant B" (trade name, manufactured by Atotech Japan K.K.) at 23° C. for one minute. Thereafter, the cured product was treated with an activator liquid "Activator Neogant 834" (trade name, manufactured by Atotech Japan K.K.) at 35° C. for 5 minutes, and then the cured product was treated with a reducing liquid "Reducer Neogant WA" (trade name, manufactured by Atotech Japan K.K.) at 30° C. for 5 minutes.

The thus-obtained laminate for evaluation was placed in a chemically copper enriched liquid ("Basic Printgant MSK-DK", "Copper Printgant MSK", and "Stabilizer Printgant MSK" (all trade name, manufactured by Atotech Japan K.K.), and electroless plating was performed until the thickness of the plating was about 0.5 μm. After the electroless plating, an annealing treatment was performed at a temperature of 120° C. for 30 minutes in order to remove residual hydrogen gas. Thereafter, copper sulfate electroplating was performed, and the annealing treatment was performed at 180° C. for 60 minutes, to form a conductor layer having a thickness of 25 μm.

With respect to the thus-obtained laminate for evaluation having a conductor layer formed therein, the vertical stripping strength at 23° C. was measured in conformity with JIS C6481 (1996) and evaluated according to the following evaluation criteria.

A: The adhesion strength to plated copper was 0.40 kN/m or more.
B: The adhesion strength to plated copper was 0.30 kN/m or more and less than 0.40 kN/m.
C: The adhesion strength to plated copper was less than 0.30 kN/m.

[3. Evaluation of HAST Resistance (Electrical Insulation Reliability after Moisture Absorption)]

A laminate having a conductor layer was obtained by performing the same operations as in the aforementioned [2. Evaluation of Adhesion Strength (Stripping Strength) to Plated Copper], except that a conductor layer having a thickness of 35 μm was formed in place of formation of the conductor layer having a thickness of 25 μm.

Subsequently a circular electrode having a diameter (φ) of 6 mm was formed by etching the conductor layer of the laminate. Subsequently a photosensitive solder resist film "FZ-2700GA" (trade name, manufactured by Showa Denko Materials Co., Ltd.) was placed on the electrode and the cured film, and using a press type vacuum laminator (trade name: "MVLP-500", manufactured by Meiki Co., Ltd.), an interlayer insulating layer was formed under a condition in which a pressure bonding pressure was 0.4 MPa, a press hot plate temperature was 80° C., an evacuation time was 25 seconds, a lamination press time was 40 seconds, and an atmospheric pressure was 4 kPa or less, to obtain a laminate for evaluation. Note that a thickness of the interlayer insulating layer was 25 μm.

The thus-obtained laminate for evaluation was subjected to whole image exposure using a parallel light exposure apparatus (trade name: "EXM-1201", manufactured by ORC MANUFACTURING CO., LTD.) equipped with an ultrahigh pressure mercury lamp as a light source at 500 mJ/cm². Subsequently the resultant was exposed with an ultraviolet exposure apparatus at an amount of exposure of 2,000 mJ/cm² and then heated at 160° C. for one hour, to obtain a cured film.

Subsequently wiring was performed such that the circular electrode was a plus pole, and the copper foil at the side of the copper-clad laminate substrate at which the circular electrode was formed was a minus pole, and the resultant was exposed with a pressure cooker (model name: "unsaturated-type highly accelerated life testing machine: PC-422RP", manufactured by Hirayama Manufacturing Corporation) under a condition at 135° C., 85%, and 5.5 V for 200 hours. A resistance value between the electrodes was measured, and the evaluation was performed according to the following criteria.
  A: The resistance value at the time of elapsing 200 hours was 10×10$^7$Ω or more.
  B: The resistance value at the time of elapsing 200 hours was 10×10$^6$Ω or more and less than 10×10$^7$Ω.
  C: The resistance value at the time of elapsing 200 hours was less than 10×10$^6$Ω.

[4. Evaluation of Desmear resistance]

While stripping off the protective film from "the photosensitive resin film having the carrier film and the protective film stuck thereon" produced in each of Examples and Comparative Examples, lamination was performed on a copper-clad laminate substrate having a thickness of 1.0 mm with a press type vacuum laminator (trade name: "MVLP-500", manufactured by Meiki Co., Ltd.) under a condition in which a pressure bonding pressure was 0.4 MPa, a press hot plate temperature was 80° C., an evacuation time was 25 seconds, a lamination press time was 25 seconds, and an atmospheric pressure was 4 kPa or less. There was thus obtained a laminate.

The obtained laminate was subjected to whole image exposure using a parallel light exposure apparatus (trade name: "EXM-1201", manufactured by ORC MANUFACTURING CO., LTD.) equipped with an ultrahigh pressure mercury lamp as a light source at 500 mJ/cm$^2$. Subsequently the resultant was exposed with an ultraviolet exposure apparatus at an amount of exposure of 2,000 mJ/cm$^2$ and then heated at 170° C. for one hour, to obtain the laminate for evaluation having a cured product (cured film) formed on the copper-clad laminate substrate.

Subsequently, regarding the laminate for evaluation, an aqueous solution containing 200 mL/L of diethylene glycol monobutyl ether and 5 g/L of sodium hydroxide was prepared as a swelling liquid, heated at 70° C., and then the laminate for evaluation was subjected to a dipping treatment for 10 minutes. Subsequently an aqueous solution containing 60 g/L of potassium permanganate and 40 g/L of sodium hydroxide was prepared as a roughening liquid, heated at 70° C., and then the laminate for evaluation was subjected to a dipping treatment for 15 minutes. Subsequently an aqueous solution of a neutralizing liquid (tin chloride (SnCl$_2$): 30 g/L, hydrogen chloride: 300 mL/L) was prepared, heated at 40° C., and then the laminate for evaluation was subjected to a dipping treatment for 5 minutes, to reduce the potassium permanganate. A desmear treatment was performed as described above.

An amount of weight loss (g/m$^2$) after the desmear treatment with respect to a dry weight before the desmear treatment was calculated, and the desmear resistance was evaluated according to the following evaluation criteria.
  A: Mass reduction rate was less than 1.0%
  B: Mass reduction rate was 1.0% or more and less than 3.0%
  C: Mass reduction rate was 3.0% or more <Synthesis Example 1> Synthesis of Acid-Modified Ethylenically Unsaturated Group and Alicyclic Structure-Containing Epoxy Derivative 1 [Component (A1) and Component (A1-1)]

350 parts by mass of a dicyclopentadiene type epoxy resin ("XD-1000" manufactured by Nippon Kayaku Co., Ltd., epoxy equivalent: 252 g/eq, softening point: 74.2° C., corresponding to the component (a1) and represented by the general formula (a1-1), ring-forming carbon number of alicyclic structure: 10), 70 parts by mass of acrylic acid (corresponding to the component (a2)), 0.5 parts by mass of methyl hydroquinone, and 120 parts by mass of carbitol acetate were charged and allowed to react with each other by heating to 90° C. and stirring, to dissolve the mixture.

Subsequently the obtained solution was cooled to 60° C., 2 parts by mass of triphenyl phosphine was added, and the mixture was heated to 100° C. to perform the reaction until an acid value of the solution became 1 mgKOH/g. To the solution after the reaction, 98 parts by mass of tetrahydrophthalic anhydride (corresponding to the component (a3)) and 85 parts by mass of carbitol acetate were added, and the mixture was heated to 80° C. to perform the reaction for 6 hours.

Thereafter, the resultant was cooled to room temperature to obtain acid-modified dicyclopentadiene type epoxy acrylate having a solid component concentration of 73% by mass (corresponding to the component (A1) and the component (A1-1), hereinafter referred to as "acid-modified ethylenically unsaturated group and alicyclic structure-containing epoxy derivative 1").

<Synthesis Example 2> Synthesis of Acid-Modified Ethylenically Unsaturated Group and Alicyclic Structure-Containing Epoxy Derivative 2 [Component (A1) and Component (A1-1)]

The same operation as in Synthesis Example 1 was performed except that the dicyclopentadiene type epoxy resin was changed to "EPICLON (registered trademark) HP-7200" (manufactured by DIC Corporation, epoxy equivalent: 254 to 264 g/eq, softening point: 56 to 66° C., corresponding to the component (a1) and represented by the general formula (a1-1), ring-forming carbon number of alicyclic structure: 10). There was thus obtained acid-modified dicyclopentadiene type epoxy acrylate having a solid component concentration of 74% by mass (corresponding to the component (A1) and the component (A1-1), hereinafter referred to as "acid-modified ethylenically unsaturated group and alicyclic structure-containing epoxy derivative 2").

<Synthesis Example 3> Synthesis of (A2-1) Acid-Modified Ethylenically Unsaturated Group-Containing Epoxy Derivative not Containing Alicyclic Structure 350 parts by mass of a biphenol F novolak type epoxy resin ("EXA-7376", manufactured by DIC Corporation, corresponding to the component (a21)), 70 parts by mass of acrylic acid (corresponding to the component (a22)), 0.5 parts by mass of methyl hydroquinone, and 120 parts by mass of carbitol acetate were charged and allowed to react with each other by heating to 90° C. and stirring, to dissolve the mixture.

Subsequently the obtained solution was cooled to 60° C., 2 parts by mass of triphenyl phosphine was added, and the mixture was heated to 100° C. to perform the reaction until an acid value of the solution became 1 mgKOH/g. To the solution after the reaction, 98 parts by mass of tetrahydrophthalic anhydride (corresponding to the component (a23)) and 85 parts by mass of carbitol acetate were added, and the mixture was heated to 80° C. to perform the reaction for 6 hours.

Thereafter, the resultant was cooled to room temperature to obtain acid-modified bisphenol F type epoxy acrylate having a solid component concentration of 73% by mass (corresponding to the component (A2-1), hereinafter referred to as "acid-modified ethylenically unsaturated group-containing epoxy derivative 3").

<Production Example 1> Production of Inorganic Filler 1

5 kg of calcined silica particles "KE-S50" (trade name, manufactured by Nippon Shokubai Co., Ltd.) was charged into a 20 L Henschel mixer equipped with a heating jacket. The Henshell mixer is equipped with a container for the mixture to be mixed, and a rotating shaft with a stirring blade at the bottom of the container, and as a device for scraping off deposits on the wall surface, a rotating shaft with a plate-shaped blade provided along the wall surface is provided on the upper surface of the container.

While stirring the calcined silica particles, a solution in which 166.7 g of silane coupling agent "KBM-13" (methyltrimethoxysilane, manufactured by Shin-Etsu Chemical Co., Ltd.) was dissolved in 208.3 g of methanol and 41.7 g of ion-exchanged water was dropped and mixed. Thereafter, the mixture of the calcined silica particles and the silane coupling agent was heated to 100° C. at a heating rate of 20° C./hour, and held at the stage of 100° C. for 5 hours for heat treatment. Thereafter, the resultant was cooled, to obtain the inorganic filler 1 treated with "a coupling agent having a methoxy group".

<Production Examples 2 to 7> Production of Inorganic Fillers 2 to 7

The same operation as in Production Example 1 was performed except that instead of "KBM-13" (methyltrimethoxysilane, manufactured by Shin-Etsu Chemical Co., Ltd.), "KBM-22" (dimethyldimethoxysilane), "KBE-13" (methyltriethoxysilane), "KBE-22" (dimethyldiethoxysilane), "KBM-403" (3-glycidoxypropyltrimethoxysilane), "KBM-502" (3-methacryloxypropylmethyldimethoxysilane) or "KBM-903" (3-aminopropyltrimethoxysilane) [all manufactured by Shin-Etsu Chemical Co., Ltd.] was used.

There was thus produced an inorganic filler 2 treated with "coupling agent having a methoxy group", inorganic fillers 3 and 4 treated with "coupling agent having an ethoxy group", an inorganic filler 5 treated with "coupling agent with a glycidyl group", an inorganic filler 6 (for comparison) treated with "coupling agent having a methacryloyl group and a methoxy group", and an inorganic filler 7 (for comparison) treated with "coupling agent having an amino group and a methoxy group". They are referred to as Production Examples 2 to 7 in this order.

Examples 1 to 6 and Comparative Examples 1 to 3

(Preparation of Photosensitive Resin Composition)

Compositions were formulated according to the compounding formulation and compounding amount shown in Table 1, and kneaded each in a 3-roll mill to prepare photosensitive resin compositions. In each of Examples, carbitol acetate was appropriately added to adjust the concentration, to obtain a photosensitive resin composition having a solid component concentration of 60% by mass.

(Preparation of Photosensitive Resin Film)

Using a 25 μm-thick polyethylene terephthalate film (trade name: G2-25, manufactured by Teijin Limited) as a carrier film, the photosensitive resin composition prepared in each of Examples was coated on the carrier film, and dried using a hot air convention drier at 100° C. for 10 minutes, to form a photosensitive resin film (that is, photosensitive layer). A film thickness of the photosensitive resin film after drying was 25 μm.

Subsequently on a surface of the photosensitive resin film at the opposite side to the side coming into contact with the carrier film, a biaxially stretched polypropylene film (trade name: MA-411, manufactured by Oji F-Tex Co., Ltd.) was stuck as a protective film, to prepare a photosensitive resin film having the carrier film and the protective film stuck thereon.

Using the thus-prepared photosensitive resin films, the respective evaluations were performed according to the aforementioned methods. The results are shown in Table 1.

TABLE 1

| | | | | Unit | Example 1 | Example 2 | Example 3 | Example 4 | Example 5 | Example 6 | Comparative example 1 | Comparative example 2 | Comparative example 3 |
|---|---|---|---|---|---|---|---|---|---|---|---|---|---|
| Photosensitive resin composition | (A) | (A1-1) | Acid-modified ethylenically unsaturated group and alicyclic structure-containing epoxy derivative 1 | parts by mass | 36 | 36 | 36 | 36 | 36 | | 36 | 36 | |
| | | | Acid-modified ethylenically unsaturated group and alicyclic structure-containing epoxy derivative 2 | parts by mass | | | | | | 36 | | | |
| | | (A2-1) | acid-modified ethylenically unsaturated group-containing epoxy derivative 3 not containing alicyclic structure | parts by mass | | | | | | | | | 36 |
| | | (Aiii) | Dipentaerythritol pentaacrylate | parts by mass | 7.4 | 7.4 | 7.4 | 7.4 | 7.4 | 7.4 | 7.4 | 7.4 | 7.4 |
| | (B) | | Photopolymerization initiator 1 | parts by mass | 0.25 | 0.25 | 0.25 | 0.25 | 0.25 | 0.25 | 0.25 | 0.25 | 0.25 |
| | | | Photopolymerization initiator 2 | parts by mass | 0.04 | 0.04 | 0.04 | 0.04 | 0.04 | 0.04 | 0.04 | 0.04 | 0.04 |
| | (C) | | Biphenyl type epoxy resin | parts by mass | 12.8 | 12.8 | 12.8 | 12.8 | 12.8 | 12.8 | 12.8 | 12.8 | 12.8 |
| | | | Epoxy-modified polybutadiene | parts by mass | 1.8 | 1.8 | 1.8 | 1.8 | 1.8 | 1.8 | 1.8 | 1.8 | 1.8 |
| | (D) | | Polyester-based elastomer | parts by mass | 2.3 | 2.3 | 2.3 | 2.3 | 2.3 | 2.3 | 2.3 | 2.3 | 2.3 |
| | (F) | (F1) | Inorganic filler 1 | parts by mass | 39.7 | | | | | | 39.7 | | 39.7 |
| | | | Inorganic filler 2 | parts by mass | | 39.7 | | | | | | | |
| | | | Inorganic filler 3 | parts by mass | | | 39.7 | | | | | | |

TABLE 1-continued

|  |  |  | Unit | Example 1 | Example 2 | Example 3 | Example 4 | Example 5 | Example 6 | Comparative example 1 | Comparative example 2 | Comparative example 3 |
|---|---|---|---|---|---|---|---|---|---|---|---|---|
|  |  | Inorganic filler 4 | parts by mass |  |  |  | 39.7 |  |  |  |  |  |
|  |  | Inorganic filler 5 | parts by mass |  |  |  |  | 39.7 |  |  |  |  |
|  | (F2) | Inorganic filler 6 | parts by mass |  |  |  |  |  |  | 39.7 |  |  |
|  |  | Inorganic filler 7 | parts by mass |  |  |  |  |  |  |  | 39.7 |  |
| Evaluation results | (1) Resolution of via (Pattern 1) |  | — | A | A | A | A | A | A | A | A | A |
|  | (2) Adhesion strength to plated copper (stripping strength) |  |  | A | A | A | A | A | A | B | B | A |
|  | (3) Electrical insulation reliability (HAST resistance) |  | — | A | A | A | A | A | A | A | A | A |
|  | (4) Desmear resistance |  | — | A | A | A | A | A | A | A | A | C |

The respective components listed in Table 1 are as follows.

Component (A);
  Acid-modified ethylenically unsaturated group and alicyclic structure-containing epoxy derivative 1 [Component (A1) and Component (A1-1)]: One obtained in Synthesis Example 1 was used.
  Acid-modified ethylenically unsaturated group and alicyclic structure-containing epoxy derivative 2 [Component (A1) and Component (A1-1)]: One obtained in Synthesis Example 2 was used.
  Acid-modified ethylenically unsaturated group-containing epoxy derivative 3 [Component (A2-1)]: One obtained in Synthesis Example 3 was used.
  Dipentaerythritol pentaacrylate [Component (Aiii)]

Component (B);
  Photopolymerization initiator 1: 2-Methyl-1-[4-(methylthio)phenyl]-2-morpholino-1-propanone, acetophenone-based compound
  Photopolymerization initiator 2: 2,4-Diethylthioxanthone, thioxanthone-based compound Component (C);
  Biphenyl type epoxy resin: "YX-4000" (trade name, manufactured by Mitsubishi Chemical Corporation)
  Epoxy-modified polybutadiene: "EPOLEAD (registered trademark) PB3600" (trade name, manufactured by Daicel Corporation)

Component (D);
  Polyester-based elastomer: "ESPEL (registered trademark) 1108" (trade name, manufactured by Showa Denko Materials Co., Ltd.)

Component (F):
  Inorganic filler 1: Silica having an average primary particle diameter of 500 nm obtained in Production Example 1
  Inorganic filler 2: Silica having an average primary particle diameter of 500 nm obtained in Production Example 2
  Inorganic filler 3: Silica having an average primary particle diameter of 500 nm obtained in Production Example 3
  Inorganic filler 4: Silica having an average primary particle diameter of 500 nm obtained in Production Example 4
  Inorganic filler 5: Silica having an average primary particle diameter of 500 nm obtained in Production Example 5
  Inorganic filler 6 (for comparison): Silica having an average primary particle diameter of 500 nm obtained in Production Example 6
  Inorganic filler 7 (for comparison): Silica having an average primary particle diameter of 500 nm obtained in Production Example 7

From Table 1, in Examples 1 to 6, the results were that the resolution of vias, the adhesion strength to plated copper, the electrical insulation reliability, and the desmear resistance were comprehensively superior to those of Comparative Examples. The exact mechanism by which such results were obtained is unknown, but it is conjectured that a difference in intramolecular force between the "photopolymerizable compound (A1) having an acidic substituent and an alicyclic structure together with an ethylenically unsaturated group" and each inorganic filler has an effect.

On the other hand, in Comparative Example 1 using the inorganic filler 6 treated with the "coupling agent having a methacryloyl group and a methoxy group" and in Comparative Example 2 using the inorganic filler 7 treated with the "coupling agent having an amino group and a methoxy group", the results were that the resolution of via, the electrical insulation reliability, and the desmear resistance were good, but the adhesion strength to plated copper was reduced. Then, in Comparative Example 3 in which the component (A) does not contain the component (A1) but contains the component (A2-1), the resolution of via, the adhesion strength to plated copper, and the electrical insulation reliability are good, but the desmear resistance was significantly reduced.

REFERENCE SIGNS LIST

100A: Multilayered printed wiring board
102: Circuit pattern
103: Interlayer insulating layer
104: Via (Via hole)
105: Seed layer
106: Resist pattern
107: Copper circuit layer
108: Solder resist layer

The invention claimed is:
1. A photosensitive resin composition comprising:
a photopolymerizable compound (A) having an ethylenically unsaturated group;
a photopolymerization initiator (B); and
an inorganic filler (F), wherein
the photopolymerizable compound (A) having an ethylenically unsaturated group includes a photopolymerizable compound (A1) having an acidic substituent and an alicyclic structure together with an ethylenically unsaturated group, and the alicyclic structure is represented by the following general formula (a):

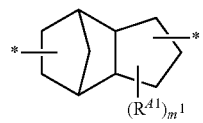

wherein, in the general formula (a), $R^{41}$ represents an alkyl group having 1 to 12 carbon atoms and may be substituted in any site in the alicyclic structure; $m^1$ is an integer of 0 to 6; and * is a binding site to another structure, and the inorganic filler (F) includes an inorganic filler surface-treated with a coupling agent without at least one functional group selected from the group consisting of an amino group and a (meth)acryloyl group.

2. The photosensitive resin composition according to claim 1, wherein the coupling agent has a group including an alkoxy group.

3. The photosensitive resin composition according to claim 1, wherein an average particle size of the inorganic filler (F) is 0.01 to 5 μm.

4. The photosensitive resin composition according to claim 1, wherein the content of the inorganic filler (F) is 5 to 80% by mass based on the total solid content.

5. The photosensitive resin composition according claim 1, wherein the photopolymerizable compound (A) having an ethylenically unsaturated group further includes at least one selected from the group consisting of a monofunctional vinyl monomer (Ai) having one polymerizable ethylenically unsaturated group, a bifunctional vinyl monomer (Aii) having two polymerizable ethylenically unsaturated groups, and a polyfunctional vinyl monomer (Aiii) having at least three polymerizable ethylenically unsaturated groups.

6. The photosensitive resin composition according to claim 1, wherein in the photopolymerizable compound (A1) having an acidic substituent and an alicyclic structure together with an ethylenically unsaturated group, the alicyclic structure is an alicyclic structure having a ring-forming carbon number of 5 to 20.

7. The photosensitive resin composition according to claim 1, wherein in the photopolymerizable compound (A1) having an acidic substituent and an alicyclic structure together with an ethylenically unsaturated group, the alicyclic structure includes two or more rings.

8. The photosensitive resin composition according to claim 1, further containing a thermosetting resin (C).

9. The photosensitive resin composition according to claim 1, further comprising an elastomer (D).

10. The photosensitive resin composition according to claim 9, wherein the elastomer (D) includes at least one selected from the group consisting of a styrene-based elastomer, an olefin-based elastomer, a polyester-based elastomer, a urethane-based elastomer, a polyamide-based elastomer, an acrylic elastomer, and a silicone-based elastomer.

11. The photosensitive resin composition according to claim 1, wherein the content of the photopolymerizable compound (A) having an ethylenically unsaturated group is 0.1 to 60% by mass based on the total solid content of the photosensitive resin composition.

12. A photosensitive resin composition for photo via formation, comprising the photosensitive resin composition according to claim 1.

13. A photosensitive resin composition for interlayer insulating layer, comprising the photosensitive resin composition according to claim 1.

14. A photosensitive resin film comprising the photosensitive resin composition according to claim 1.

15. A photosensitive resin film for interlayer insulating layer, comprising the photosensitive resin composition according to claim 1.

16. A multilayered printed wiring board comprising an interlayer insulating layer formed of the photosensitive resin composition according to claim 1.

17. A multilayered printed wiring board comprising an interlayer insulating layer formed of the photosensitive resin film according to claim 14.

18. A semiconductor package comprising the multilayered printed wiring board according claim 16 and a semiconductor element.

19. A method for producing a multilayered printed wiring board, comprising the following (1) to (4):
    (1) laminating the photosensitive resin film according to claim 14 on one surface or both surfaces of a circuit substrate;
    (2) exposing and developing the photosensitive resin film laminated in the above (1), to form an interlayer insulating layer having a via;
    (3) subjecting the via and the interlayer insulating layer to a roughening treatment; and
    (4) forming a circuit pattern on the interlayer insulating layer.

* * * * *